US010269867B2

(12) United States Patent
Yokoyama et al.

(10) Patent No.: US 10,269,867 B2
(45) Date of Patent: Apr. 23, 2019

(54) SEMICONDUCTOR DEVICE, MEMORY CIRCUIT, METHOD OF MANUFACTURING SEMICONDUCTOR DEVICE

(71) Applicant: SONY CORPORATION, Tokyo (JP)

(72) Inventors: Takashi Yokoyama, Kanagawa (JP); Taku Umebayashi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/107,977

(22) PCT Filed: Dec. 11, 2014

(86) PCT No.: PCT/JP2014/082871
§ 371 (c)(1),
(2) Date: Jun. 24, 2016

(87) PCT Pub. No.: WO2015/104947
PCT Pub. Date: Jul. 16, 2015

(65) Prior Publication Data
US 2016/0322422 A1   Nov. 3, 2016

(30) Foreign Application Priority Data
Jan. 8, 2014   (JP) .................................. 2014-001806

(51) Int. Cl.
H01L 29/04   (2006.01)
H01L 27/22   (2006.01)
(Continued)

(52) U.S. Cl.
CPC .... H01L 27/228 (2013.01); H01L 21/823406 (2013.01); H01L 21/823487 (2013.01);
(Continued)

(58) Field of Classification Search
CPC ............ H01L 29/045; H01L 29/66272; H01L 29/66325; H01L 29/7397
See application file for complete search history.

(56) References Cited
U.S. PATENT DOCUMENTS

2002/0096709 A1* 7/2002 Wu ..................... H01L 29/7813
                                                        257/329
2002/0140016 A1* 10/2002 Cha ....................... H01L 27/228
                                                        257/302
(Continued)

FOREIGN PATENT DOCUMENTS

JP   2004-214457 A   7/2004
JP   2005-012213 A   1/2005
(Continued)

Primary Examiner — Cuong Q Nguyen
(74) Attorney, Agent, or Firm — Chip Law Group

(57) ABSTRACT

A semiconductor device of the technology includes a first diffusion section (22), a second diffusion section (21), a channel section (23), a gate section (24), and a stress application section (31, 32, or 33). In a semiconductor layer (10) having a groove (10A), the first diffusion section (22) is formed at or in the vicinity of a bottom of the groove (10A), the second diffusion section (21) is formed at an upper end of the groove (10A), and the channel section (23) is formed between the first diffusion section (22) and the second diffusion section (21). The gate section (24) is buried in the groove (10A) at a position opposing the channel section (23). The stress application section (31, 32, or 33) applies one of compressive stress and tensile stress to the channel section (23) in a normal direction to the semiconductor layer (10).

21 Claims, 37 Drawing Sheets

(51) Int. Cl.
    *H01L 21/8234*     (2006.01)
    *H01L 29/423*     (2006.01)
    *H01L 29/768*     (2006.01)
    *H01L 43/02*     (2006.01)
    *H01L 27/24*     (2006.01)
    *H01L 29/78*     (2006.01)

(52) U.S. Cl.
    CPC .... *H01L 27/2454* (2013.01); *H01L 29/42396* (2013.01); *H01L 29/768* (2013.01); *H01L 29/7827* (2013.01); *H01L 29/7843* (2013.01); *H01L 29/7846* (2013.01); *H01L 43/02* (2013.01); *H01L 29/045* (2013.01)

(56) References Cited

U.S. PATENT DOCUMENTS

2012/0196414 A1*   8/2012   Ngai ................ H01L 29/66734
                                                                  438/268
2012/0313161 A1*  12/2012   Grivna ................ H01L 29/7827
                                                                  257/330

FOREIGN PATENT DOCUMENTS

| JP | 2006-191109 A | 7/2006 |
| JP | 2006-245267 A | 9/2006 |
| JP | 2007-329239 A | 12/2007 |
| JP | 2008-226901 A | 9/2008 |
| JP | 2009-130098 A | 6/2009 |
| JP | 2013-115158 A | 6/2013 |
| JP | 2013-187482 A | 9/2013 |
| WO | 2009/096464 A | 8/2009 |
| WO | 2010/010865 A | 1/2010 |

\* cited by examiner

[ FIG. 1 ]
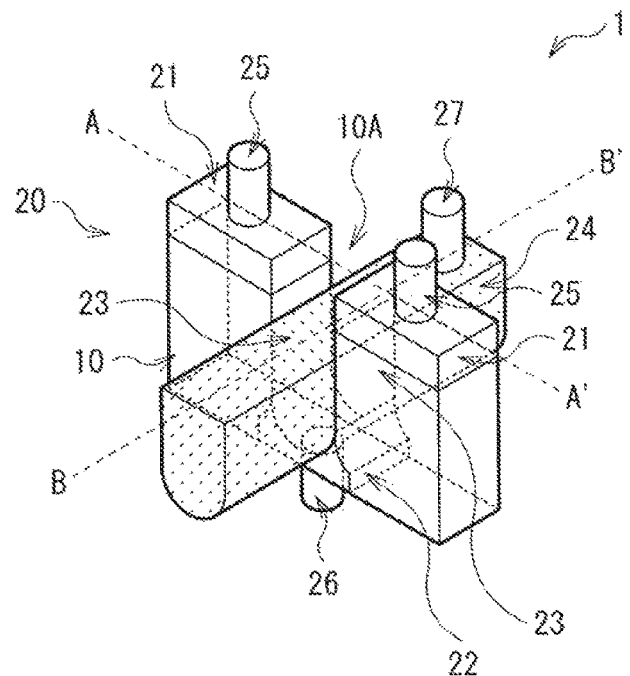
[ FIG. 2 ]
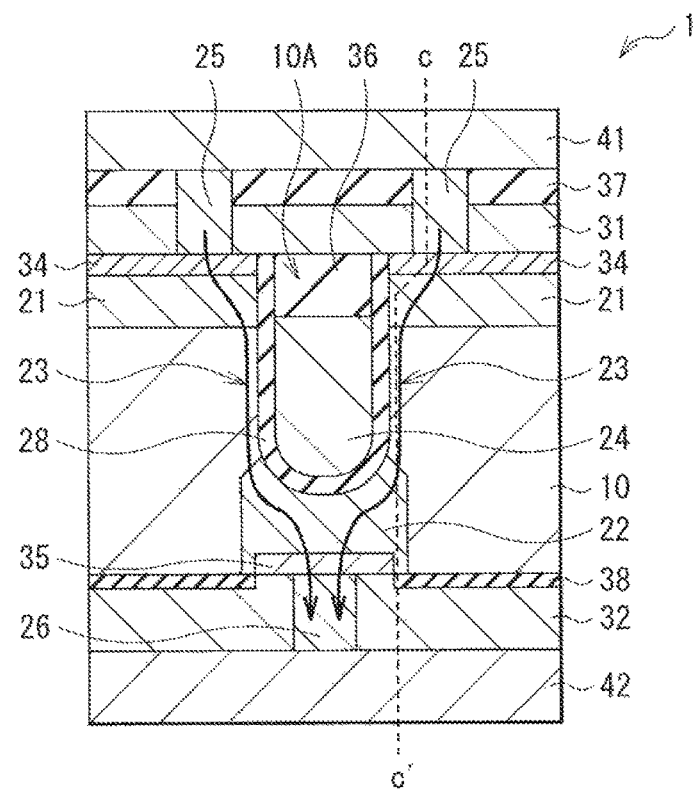

[FIG. 3]
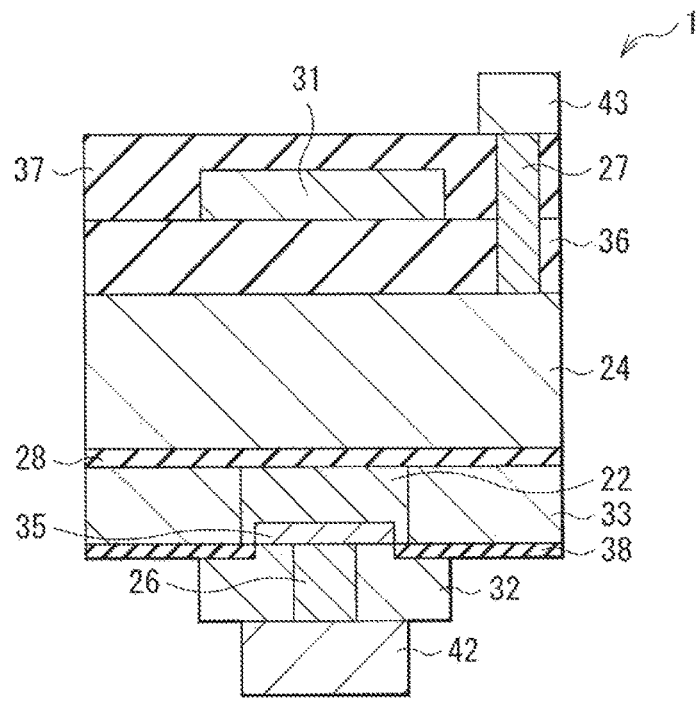
[FIG. 4]
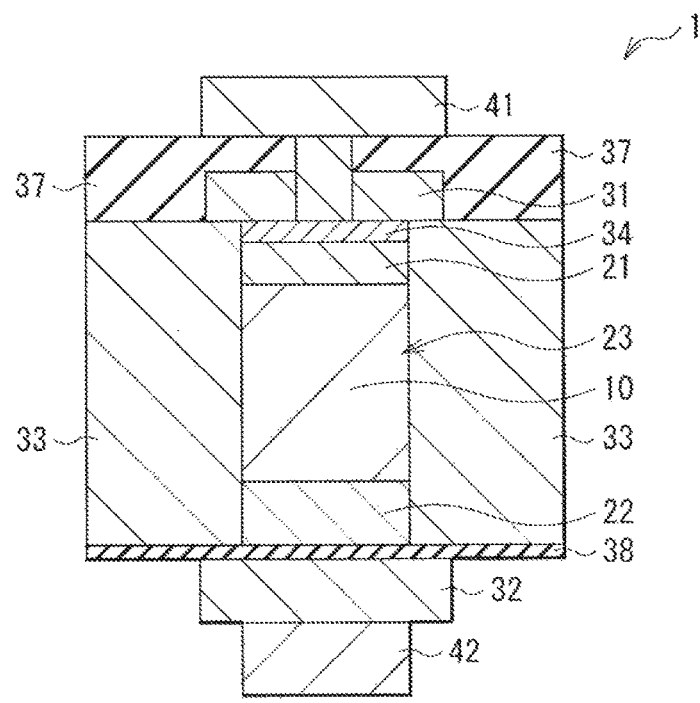

[ FIG. 5 ]
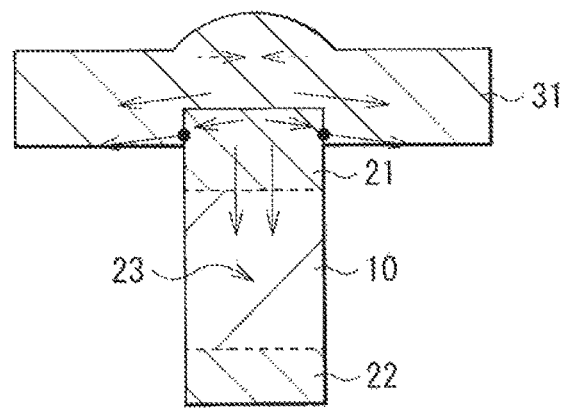
[ FIG. 6 ]
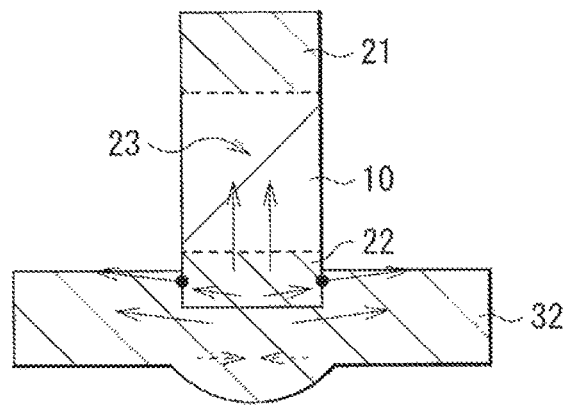

[ FIG. 7 ]
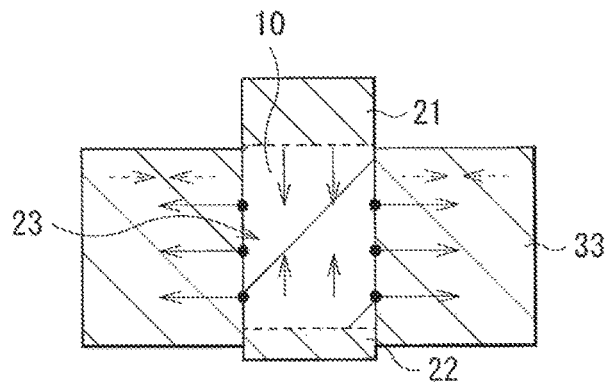
[ FIG. 8 ]
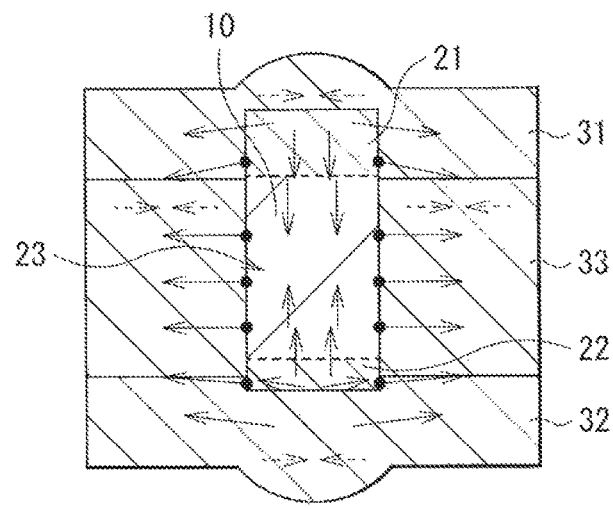
[ FIG. 9 ]
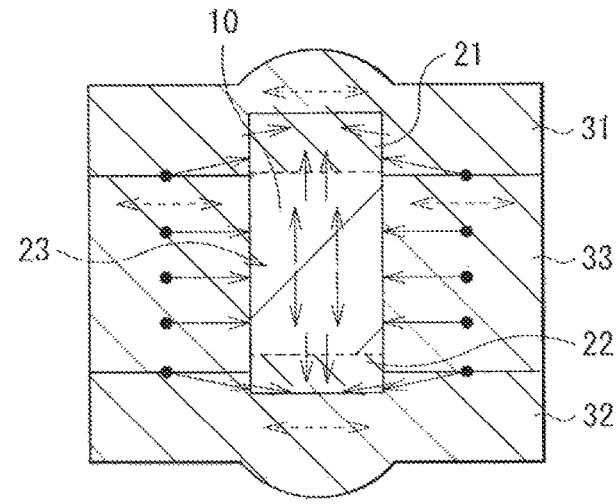

[FIG. 10]
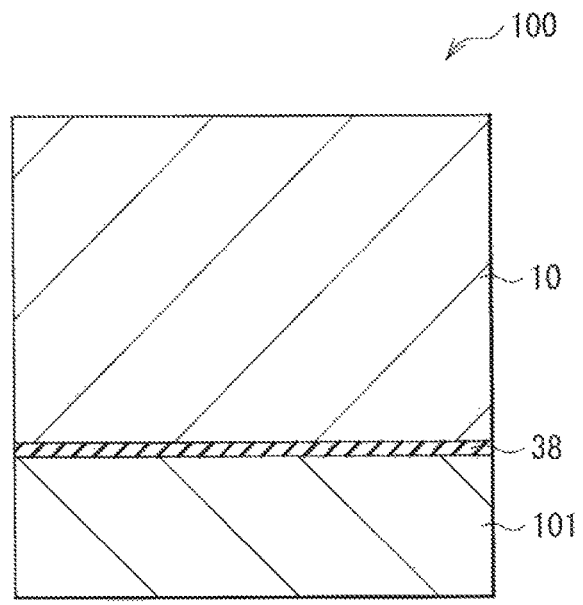
[FIG. 11]
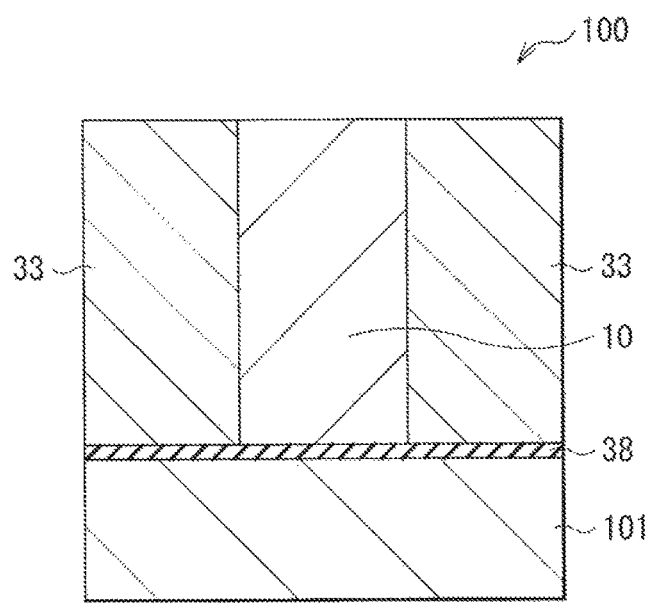

[ FIG. 12 ]
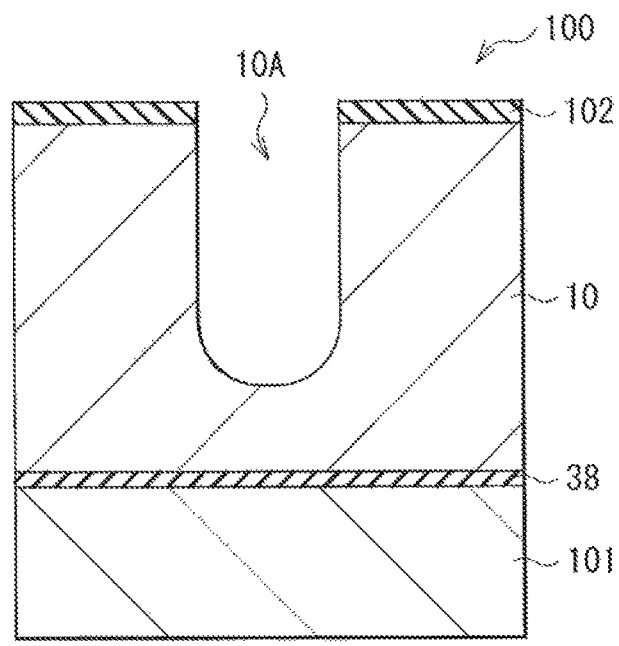
[ FIG. 13 ]
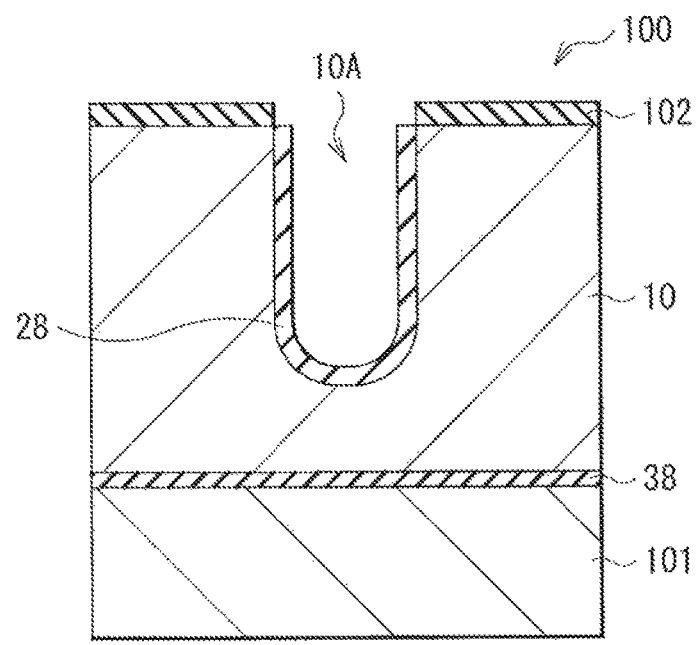

[ FIG. 14 ]
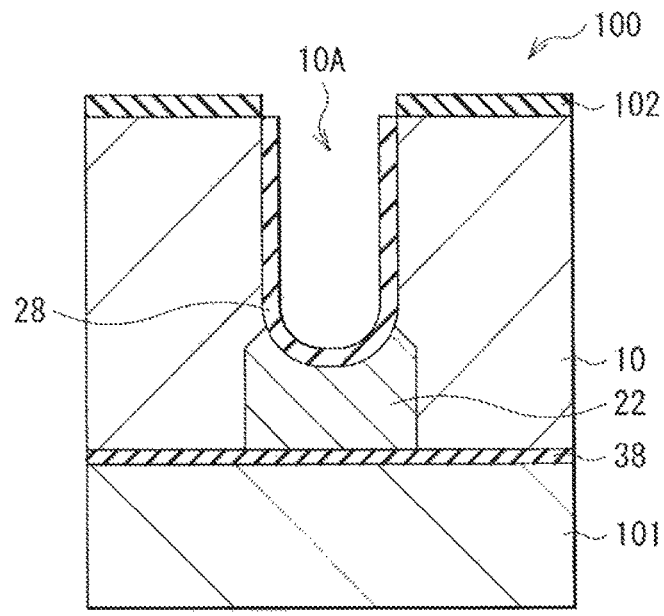
[ FIG. 15 ]
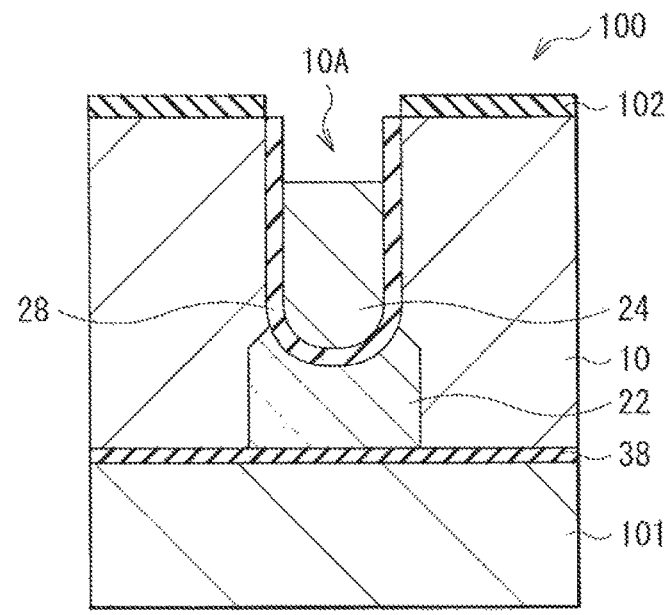

[ FIG. 16 ]
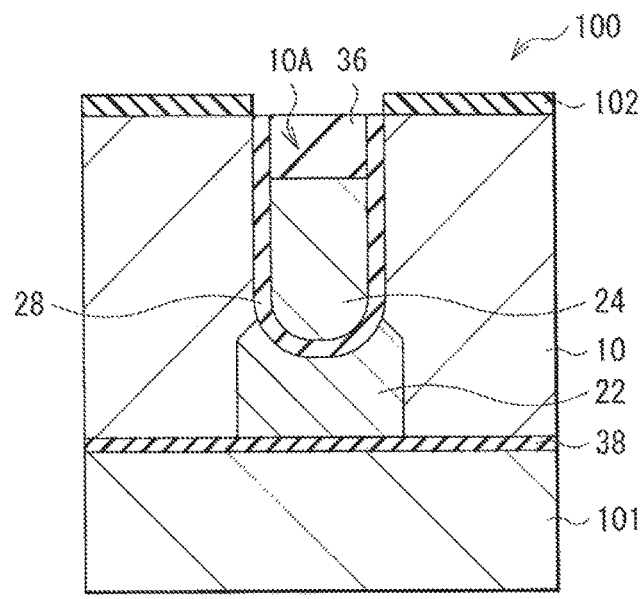
[ FIG. 17 ]
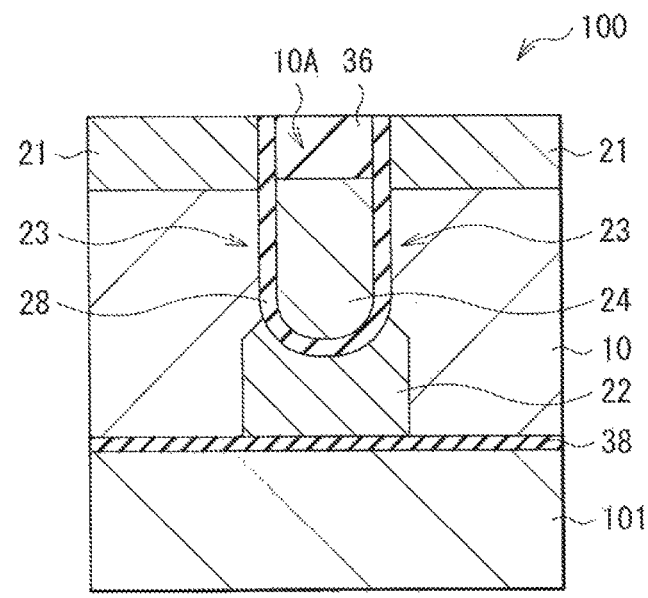

[ FIG. 18 ]
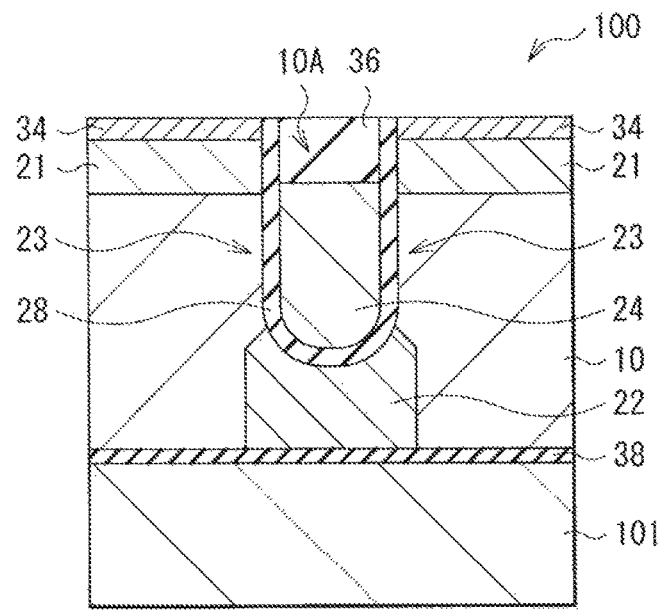
[ FIG. 19 ]
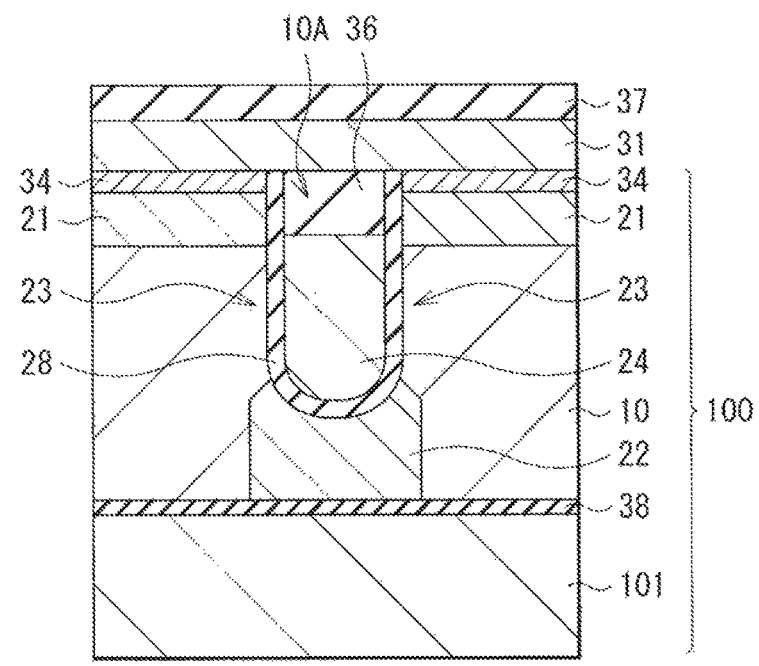

[ FIG. 20 ]
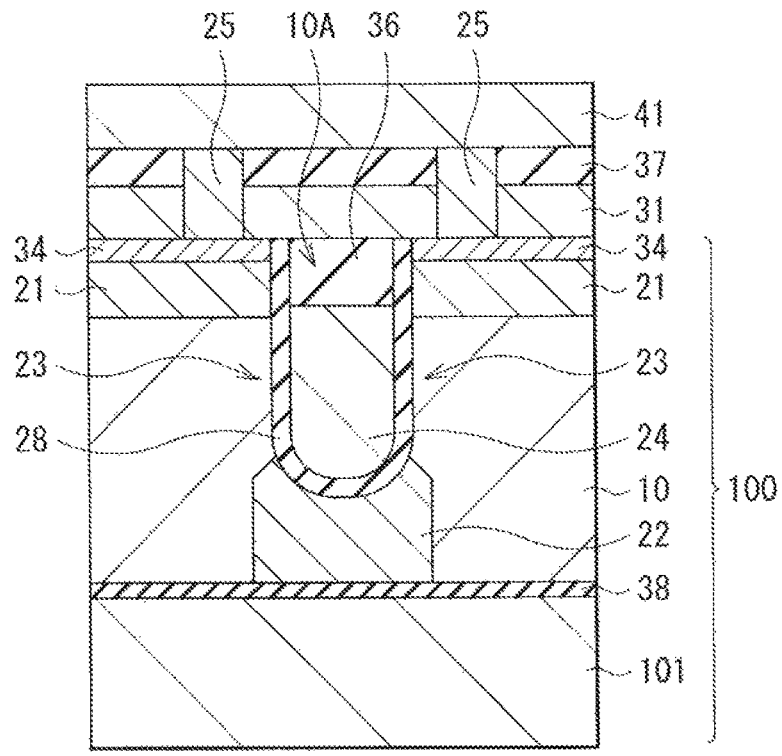
[ FIG. 21 ]
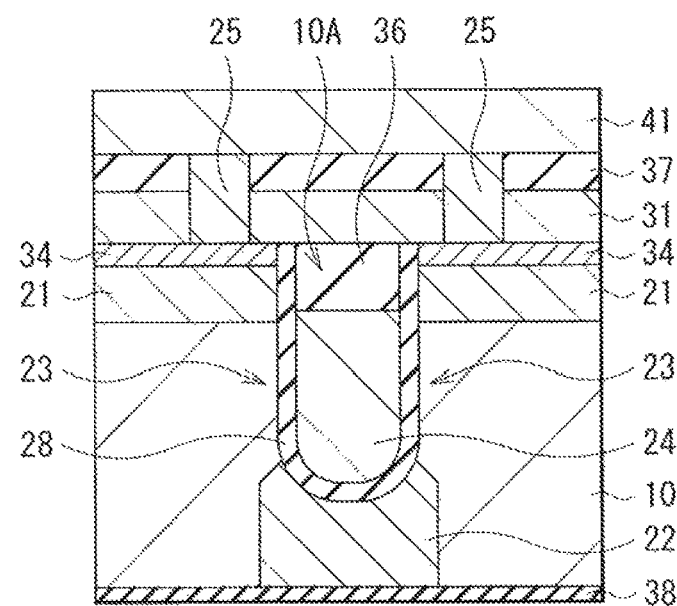

[ FIG. 22 ]
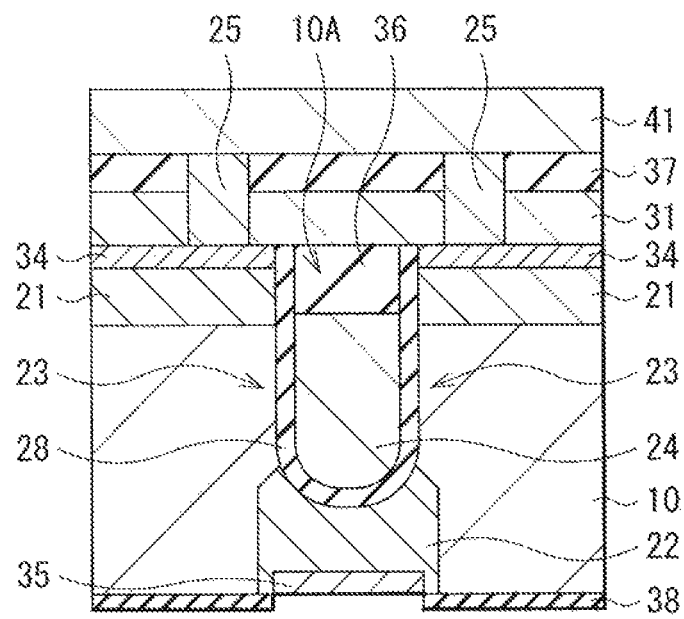
[ FIG. 23 ]
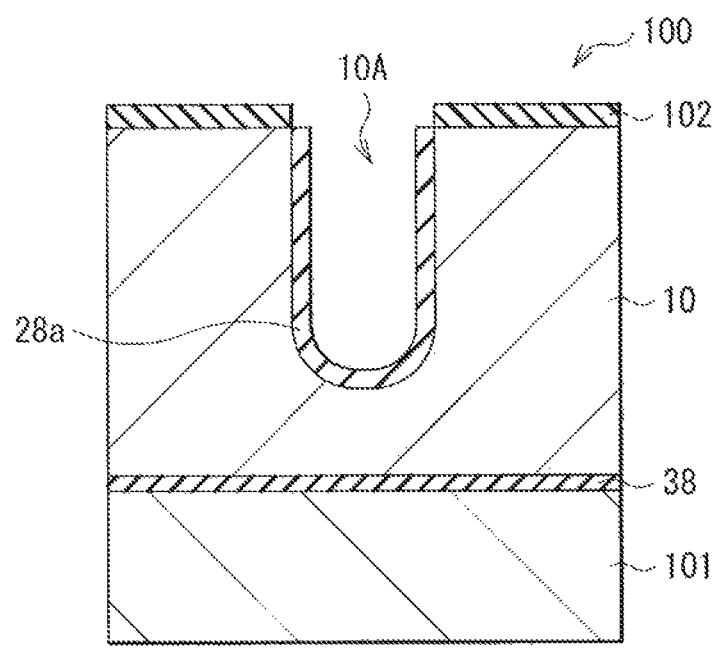

[ FIG. 24 ]
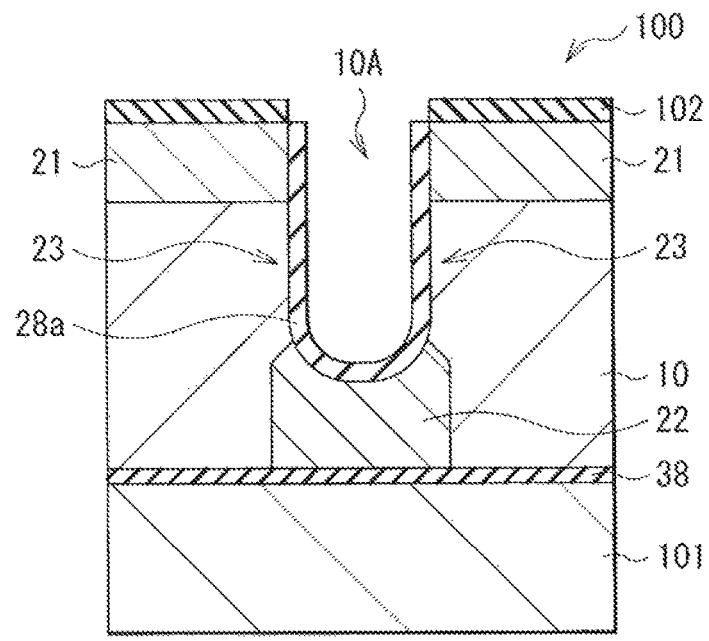
[ FIG. 25 ]
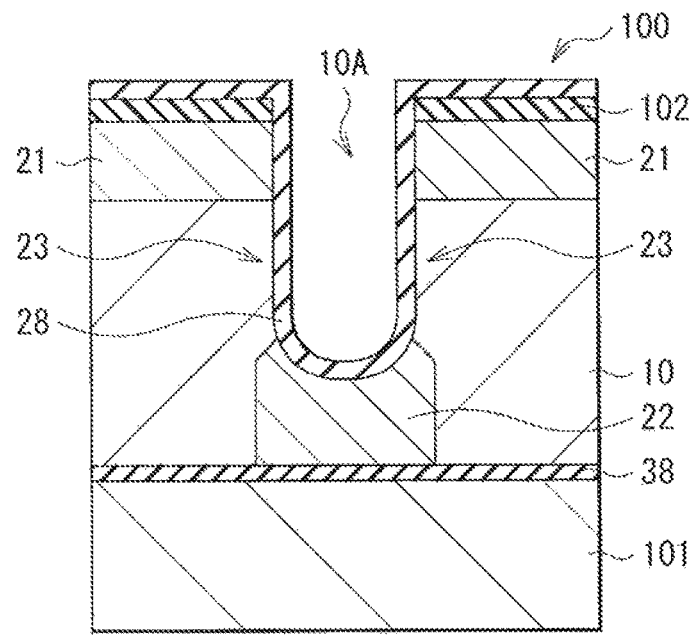

[FIG. 26]
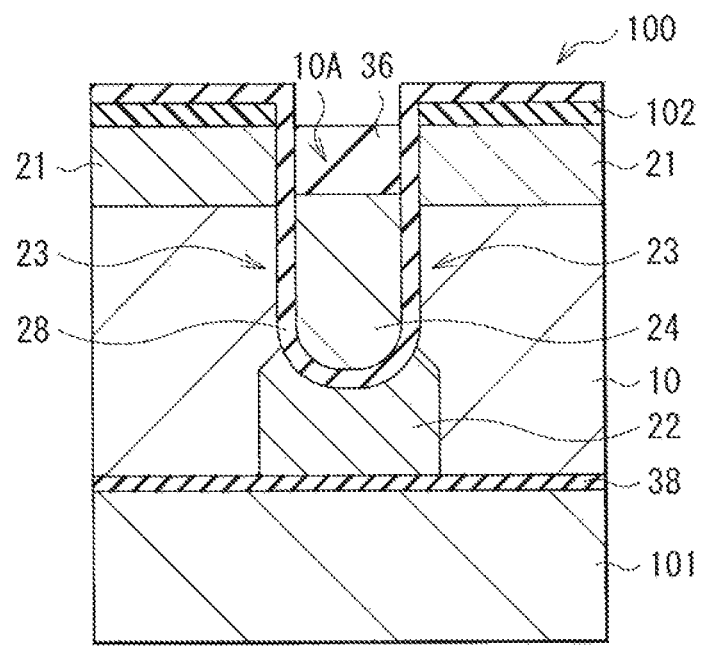
[FIG. 27]
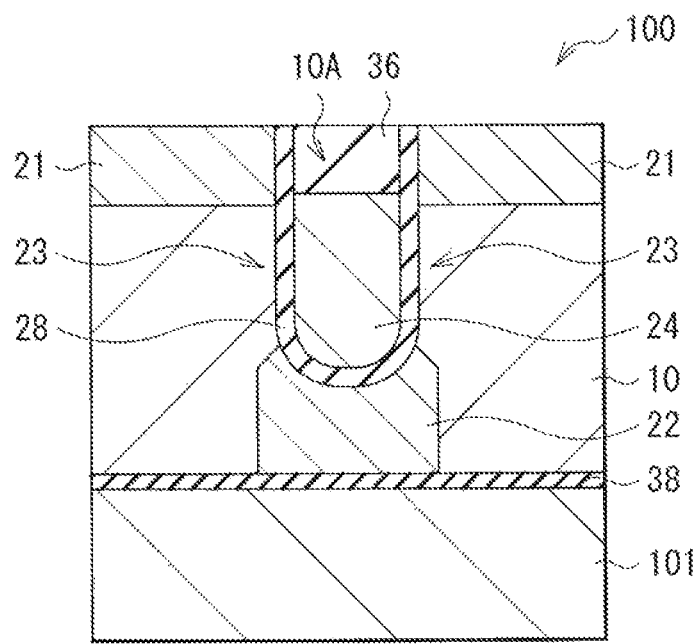

[ FIG. 28 ]
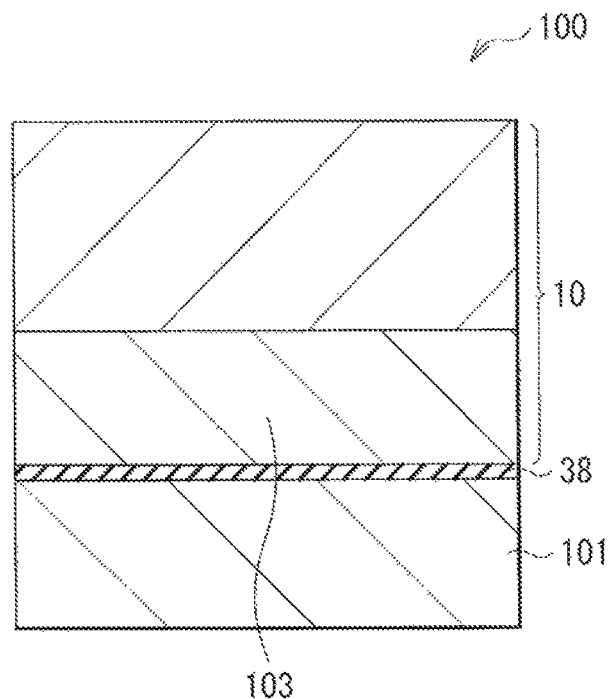
[ FIG. 29 ]
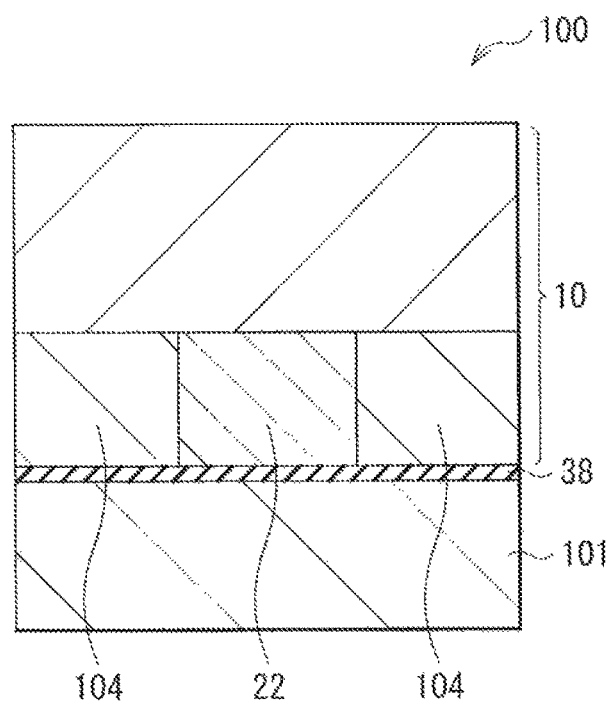

[ FIG. 30 ]
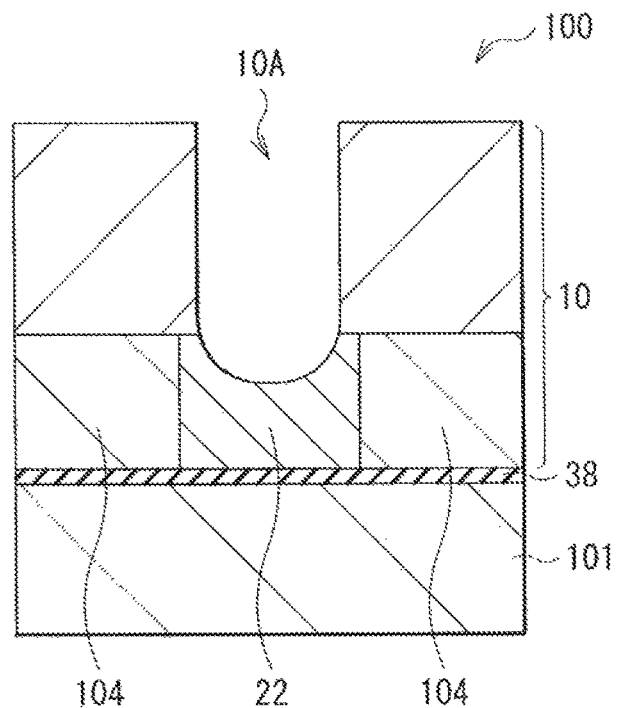
[ FIG. 31 ]
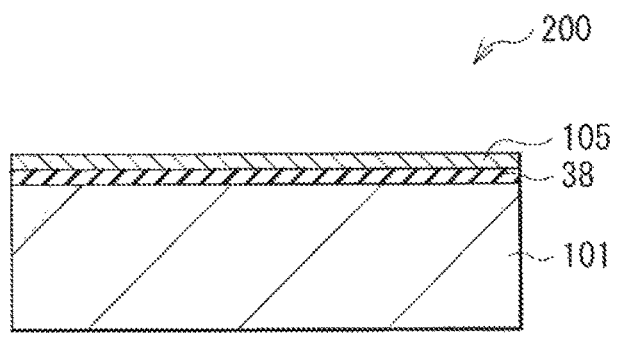

[ FIG. 32 ]
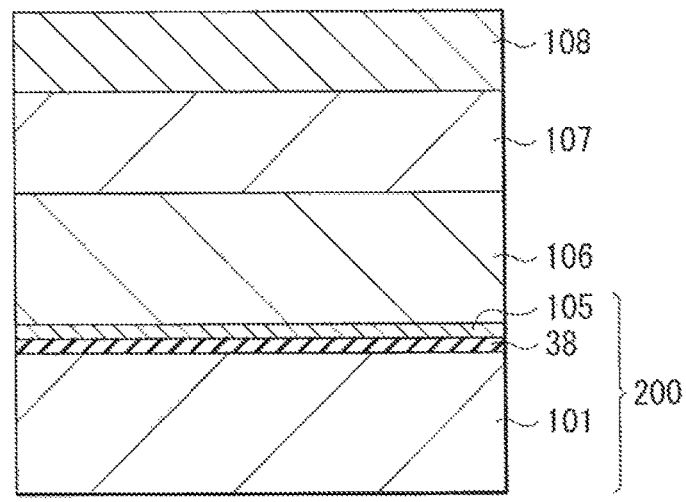
[ FIG. 33 ]
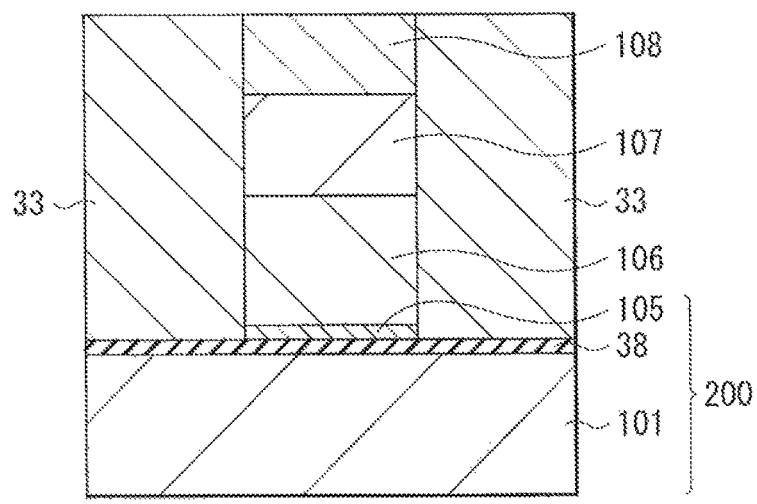

[ FIG. 34 ]
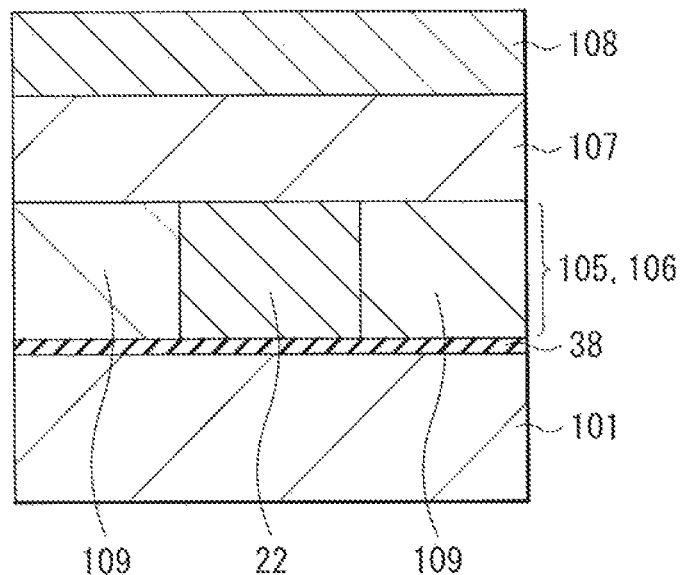
[ FIG. 35 ]
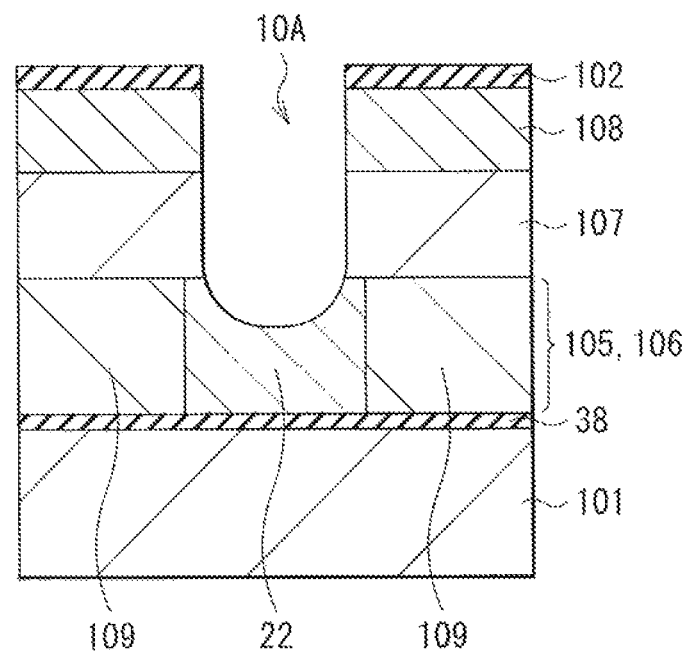

[ FIG. 36 ]
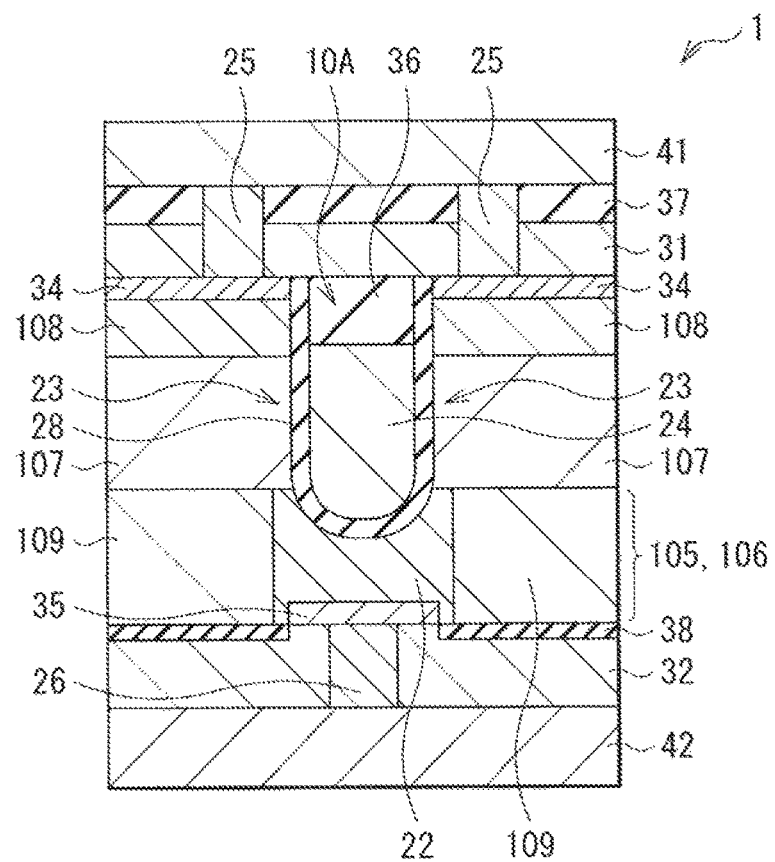
[ FIG. 37 ]
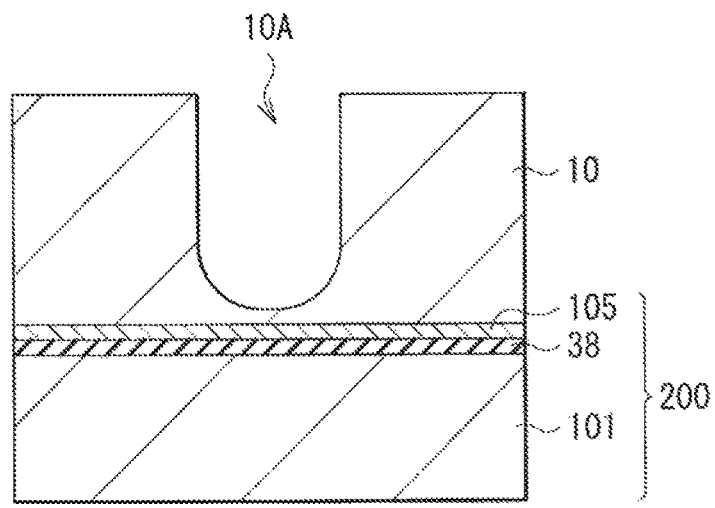

[ FIG. 38 ]
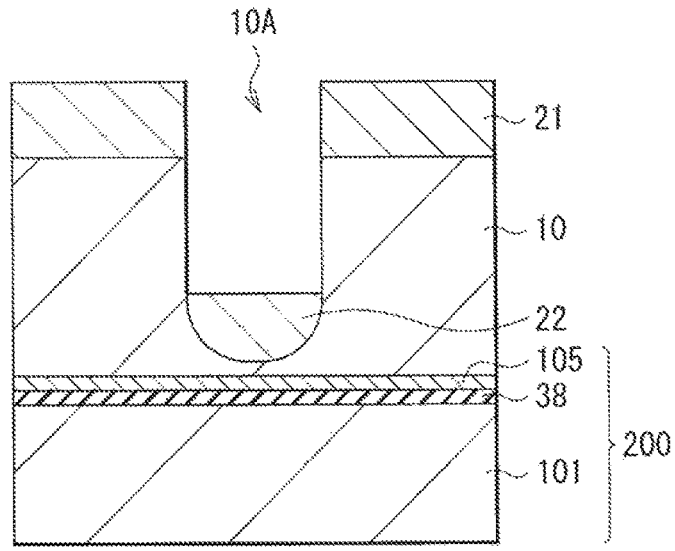
[ FIG. 39 ]
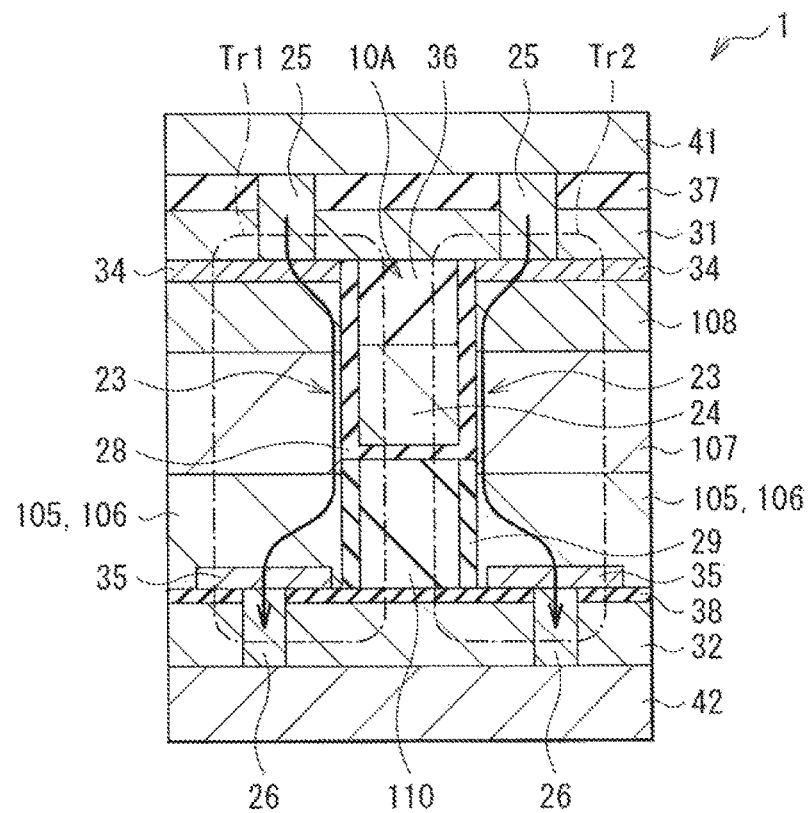

[ FIG. 40 ]
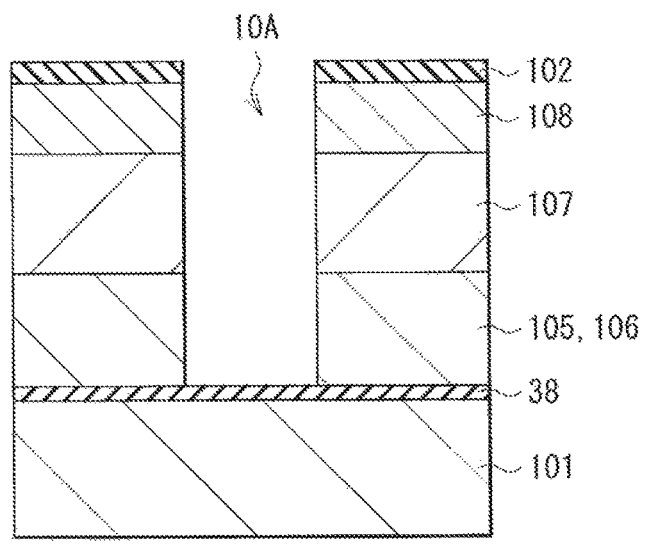
[ FIG. 41 ]
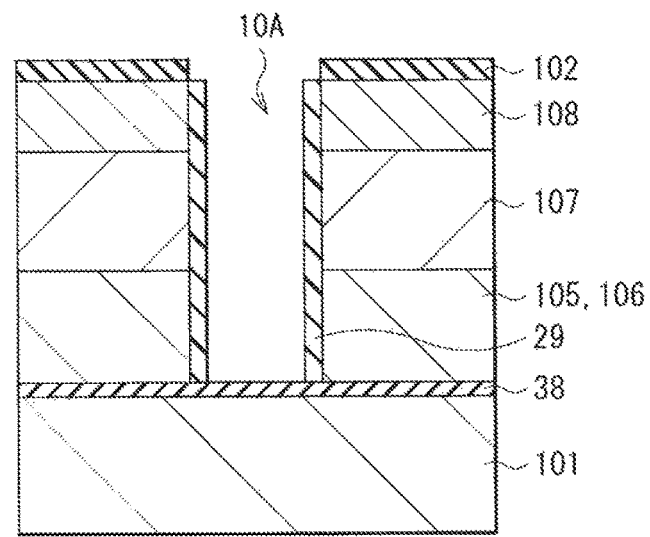

[ FIG. 42 ]
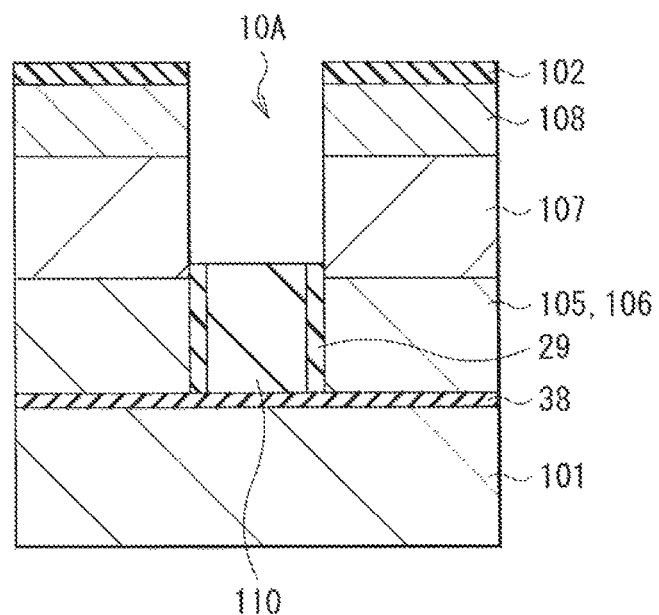
[ FIG. 43 ]
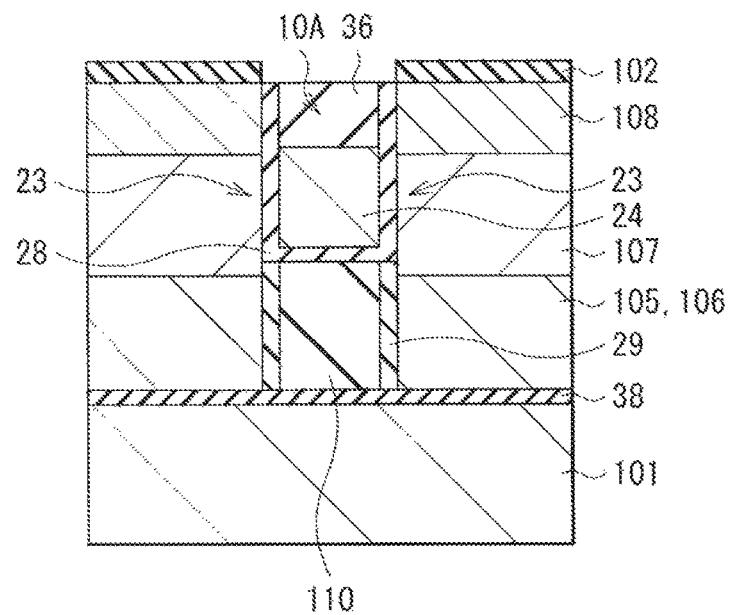

[FIG. 44]
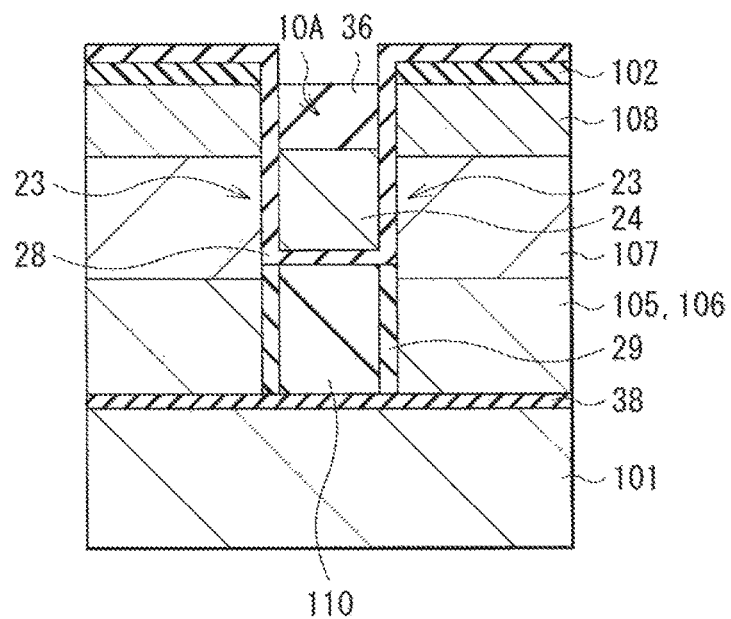
[FIG. 45]
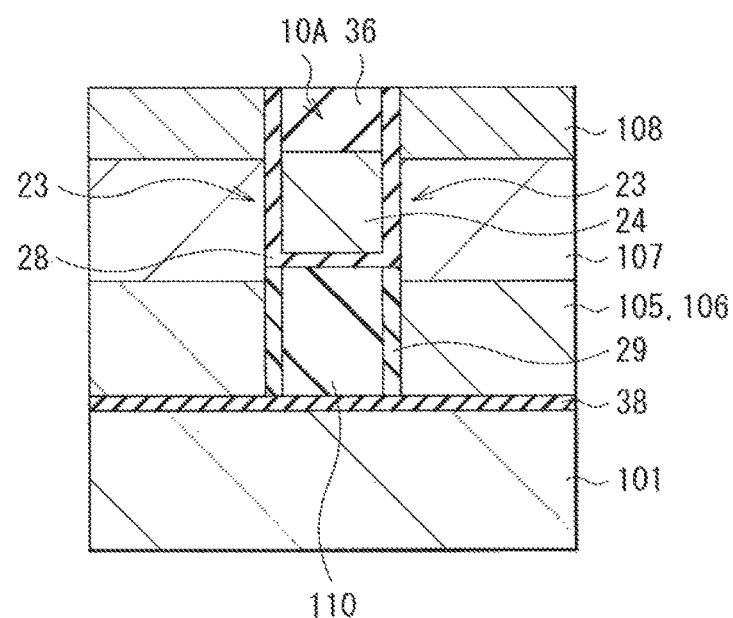

[ FIG. 46 ]
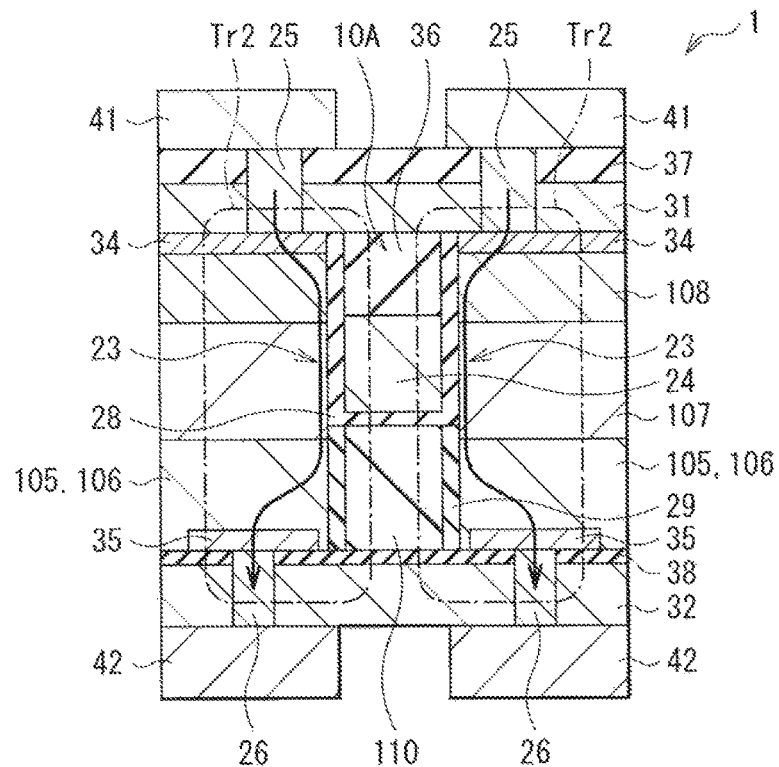
[ FIG. 47 ]
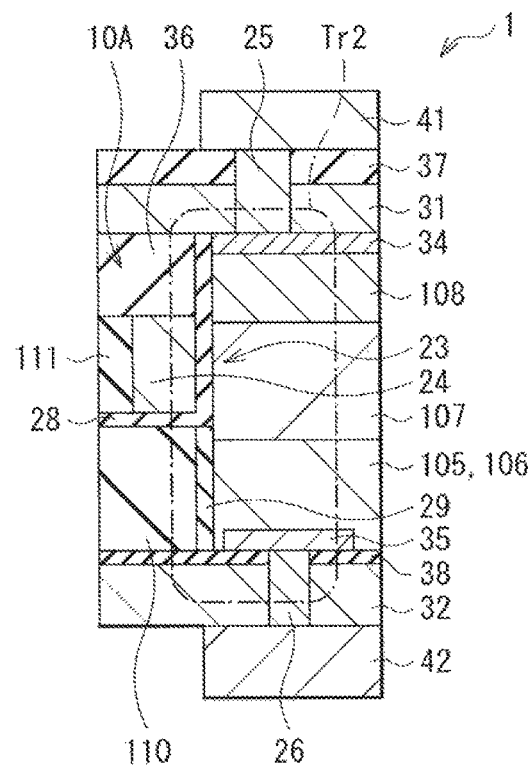

[ FIG. 48 ]
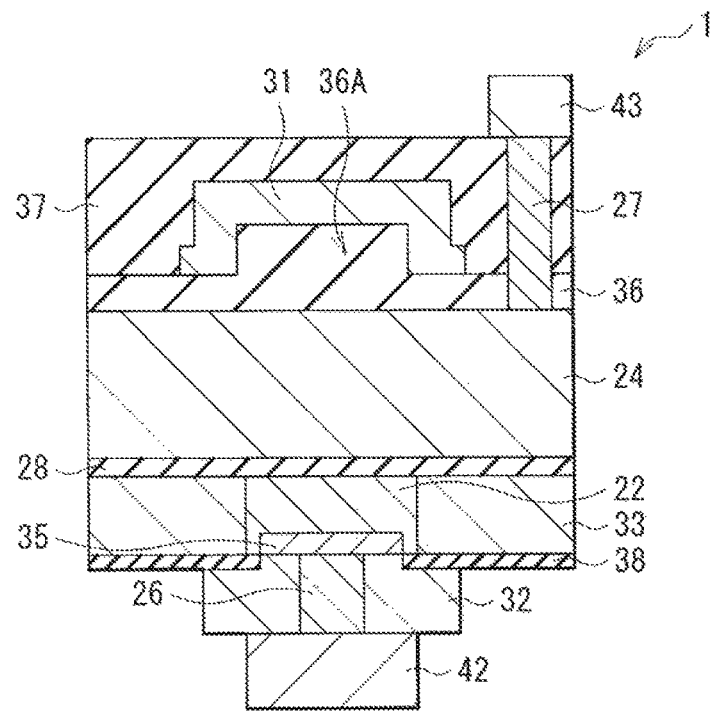
[ FIG. 49 ]
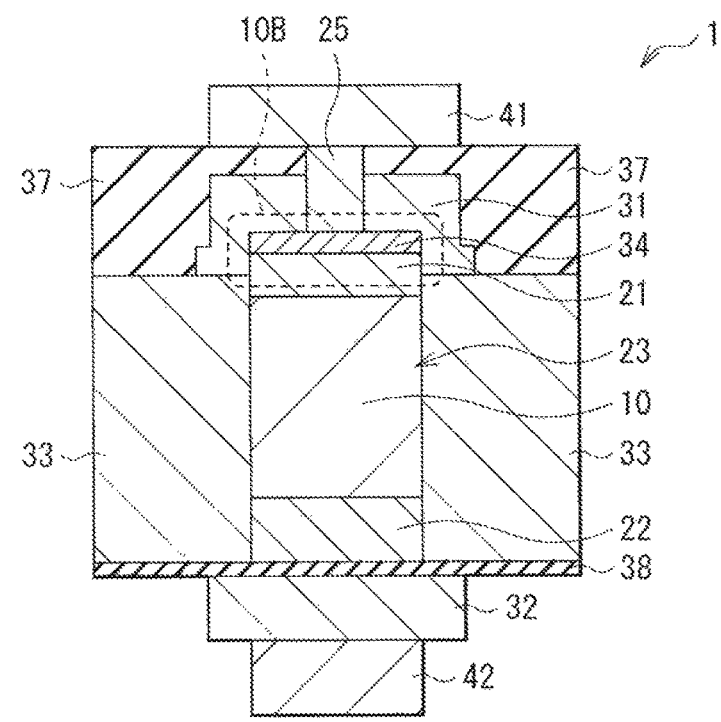

[FIG. 50]
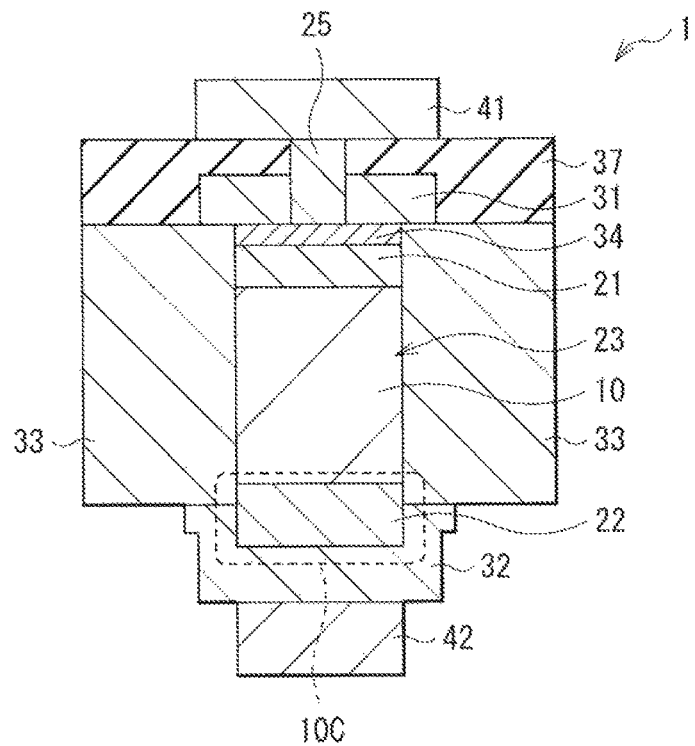
[FIG. 51]
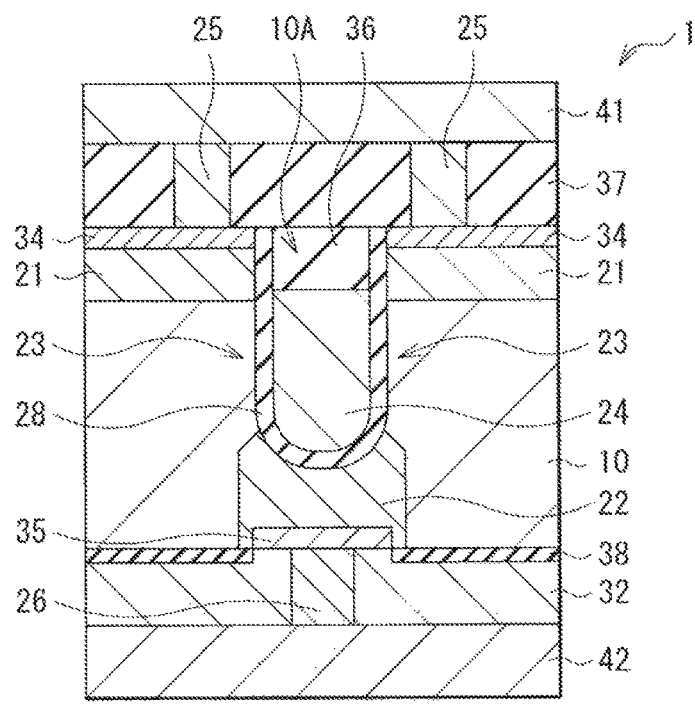

[FIG. 52]
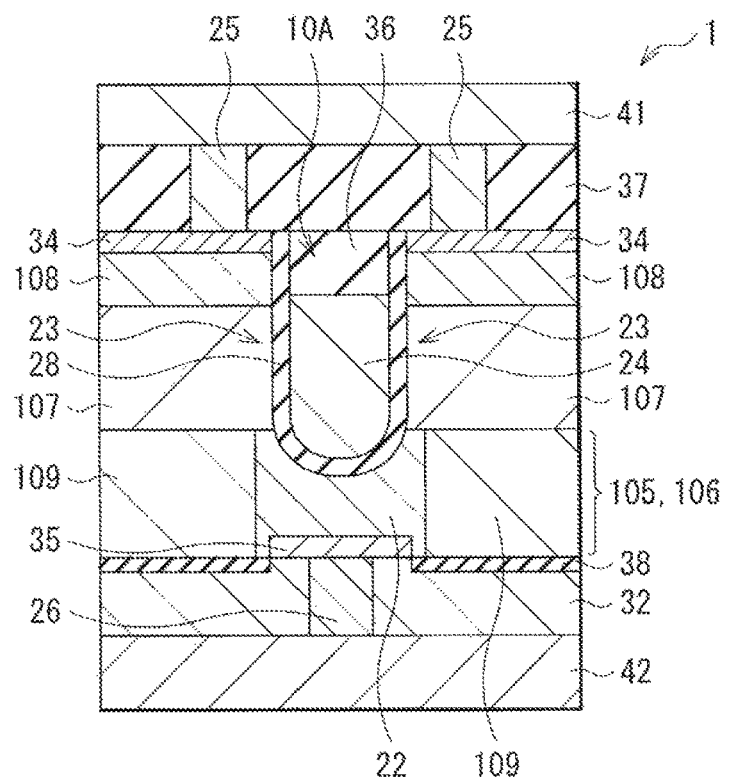
[FIG. 53]
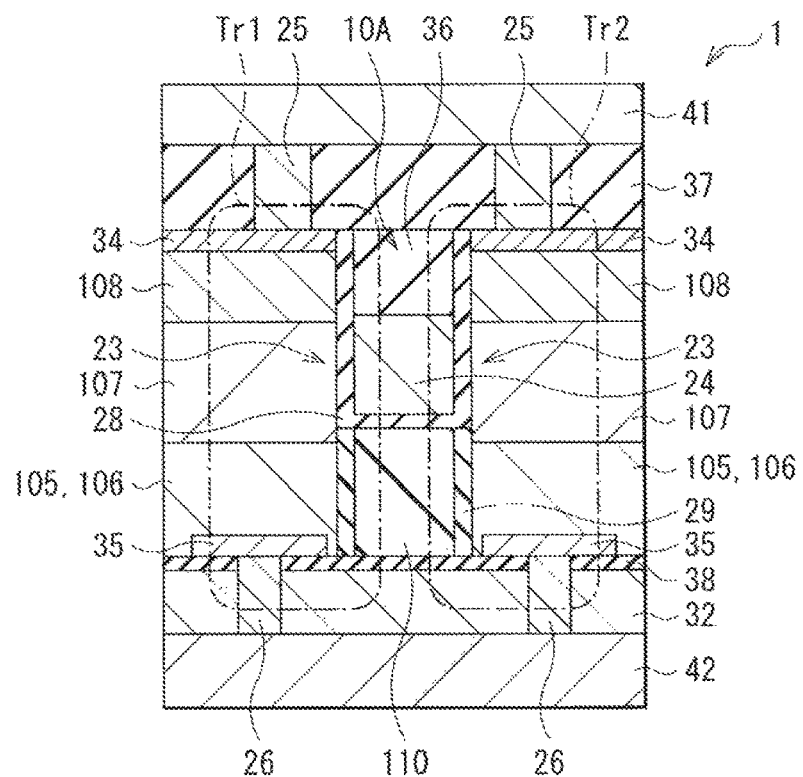

[FIG. 54]
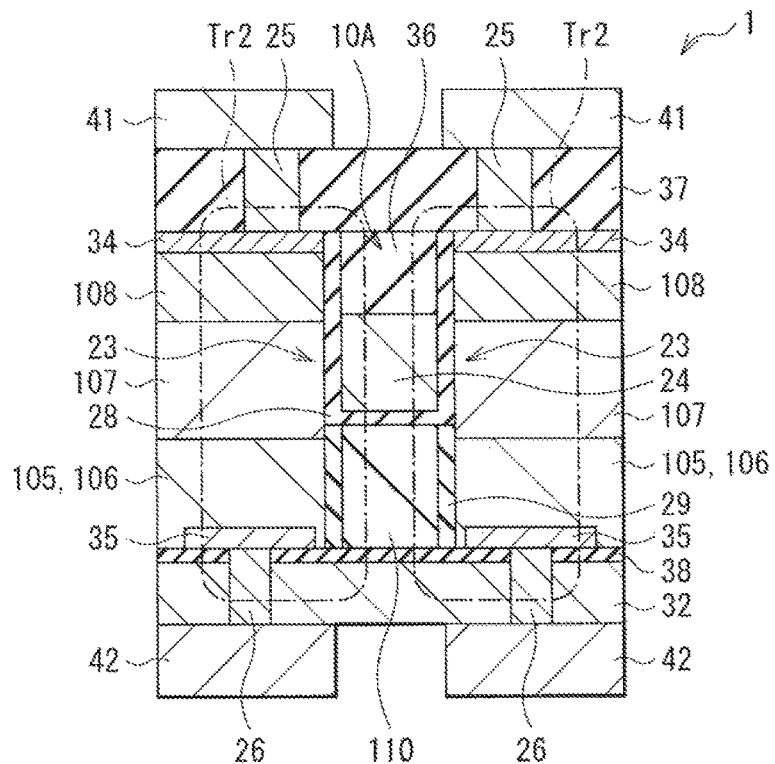
[FIG. 55]
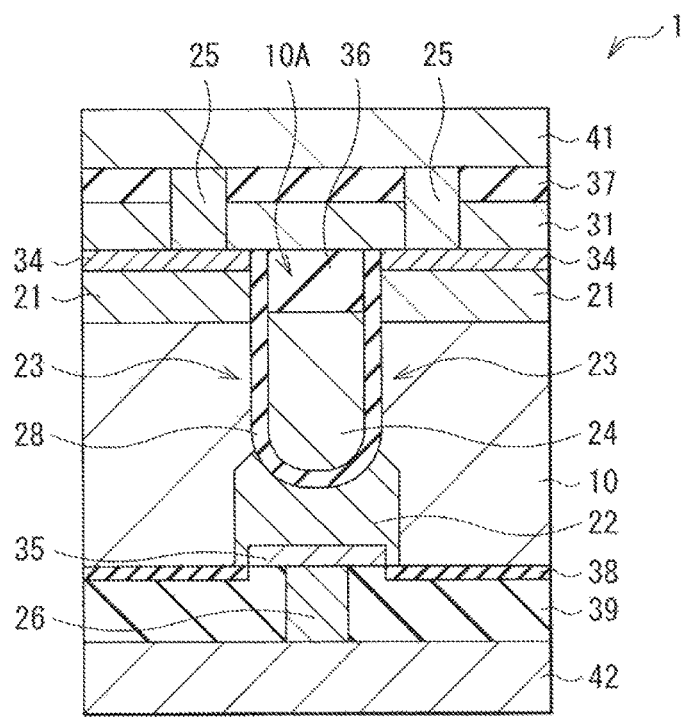

[FIG. 56]
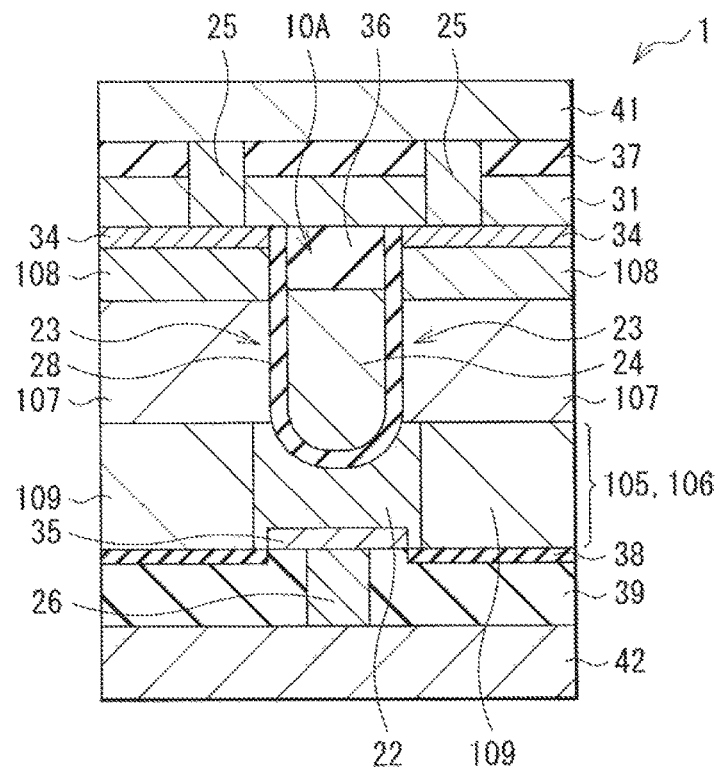
[FIG. 57]
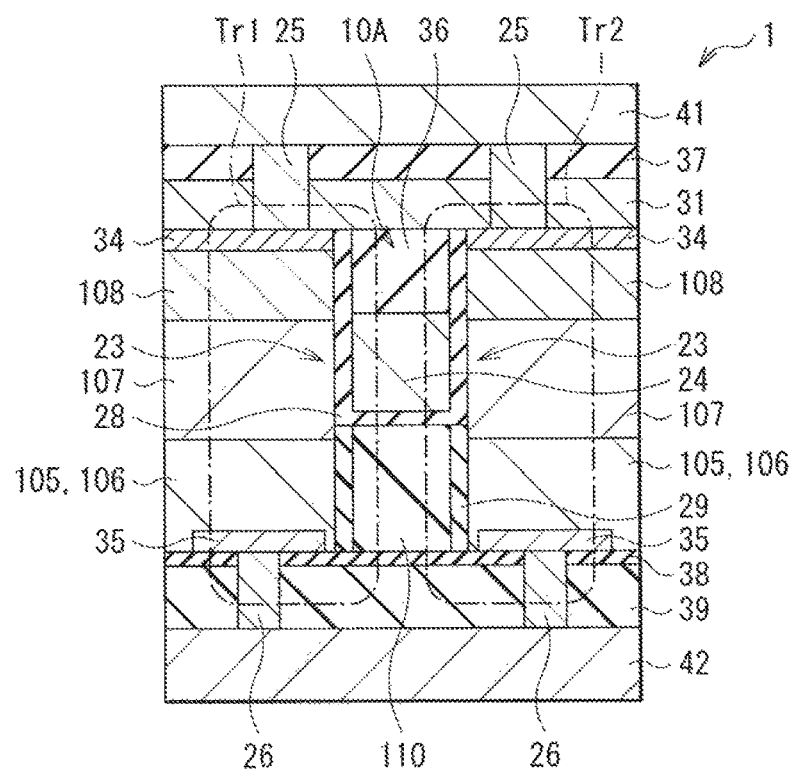

[ FIG. 58 ]
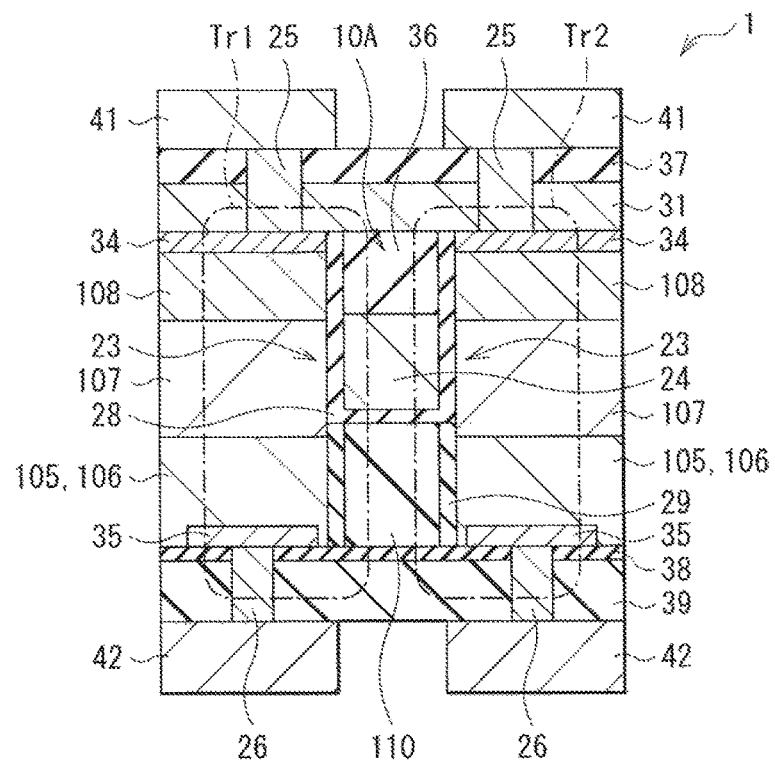
[ FIG. 59 ]
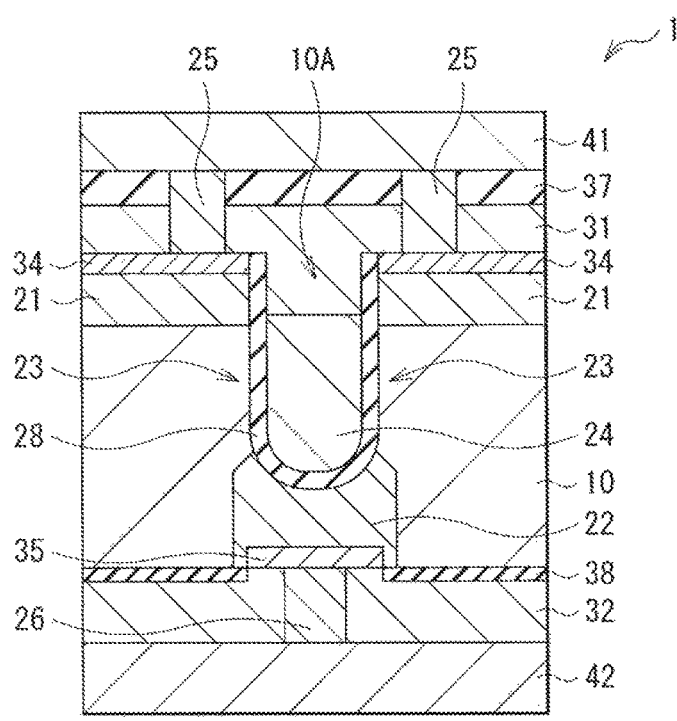

[ FIG. 60 ]
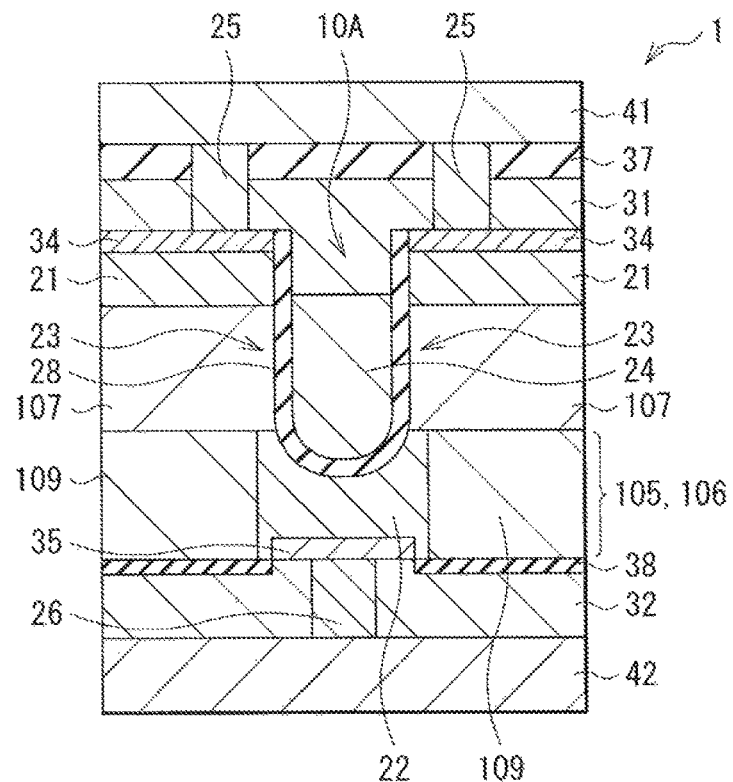
[ FIG. 61 ]
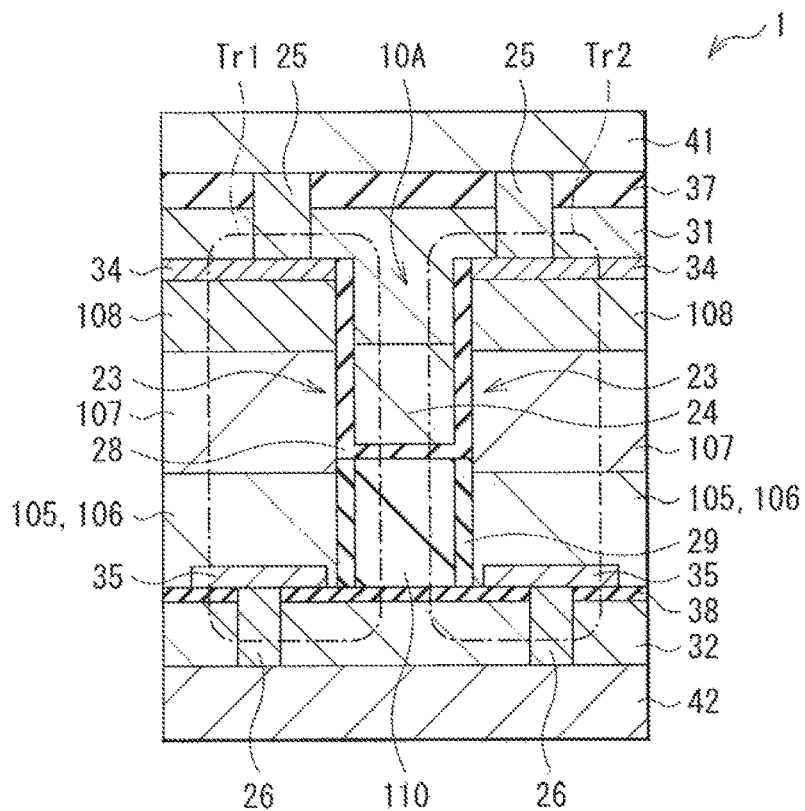

[ FIG. 62 ]
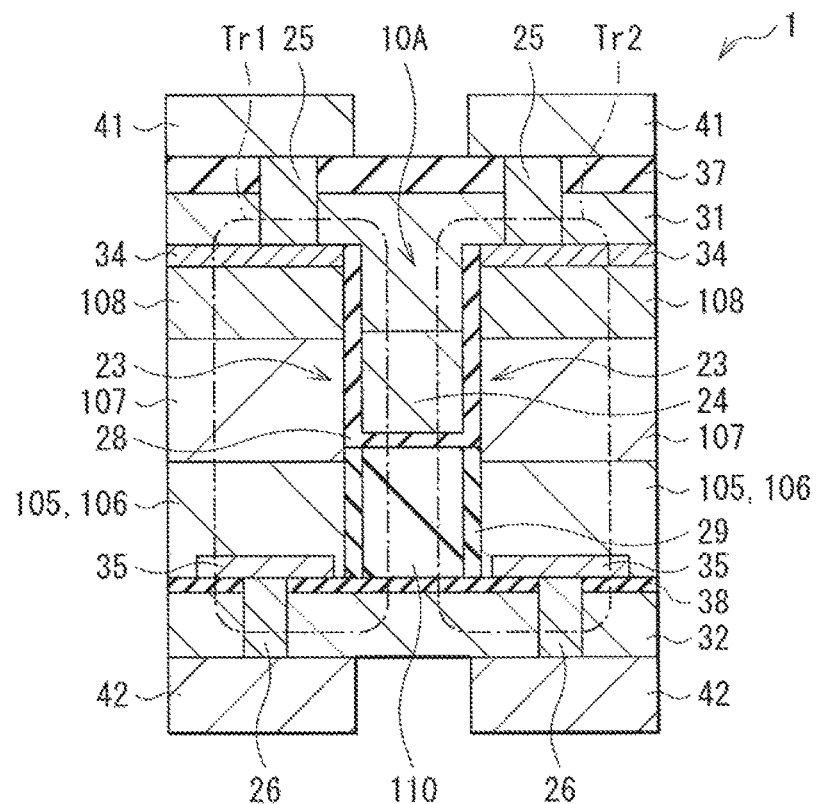
[ FIG. 63 ]
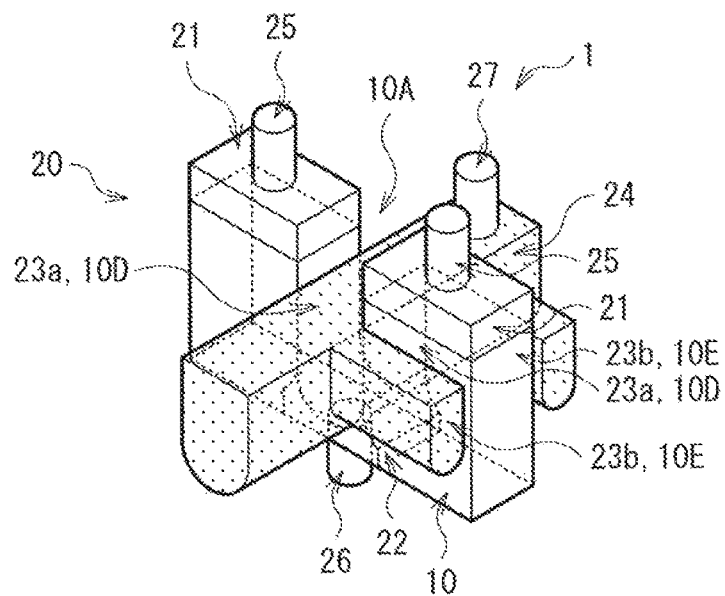

[ FIG. 64 ]
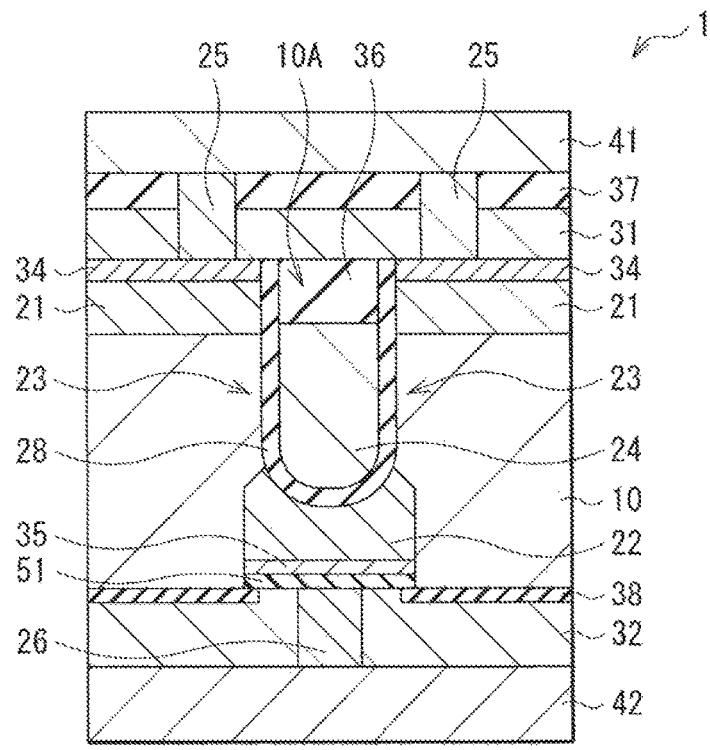
[ FIG. 65 ]
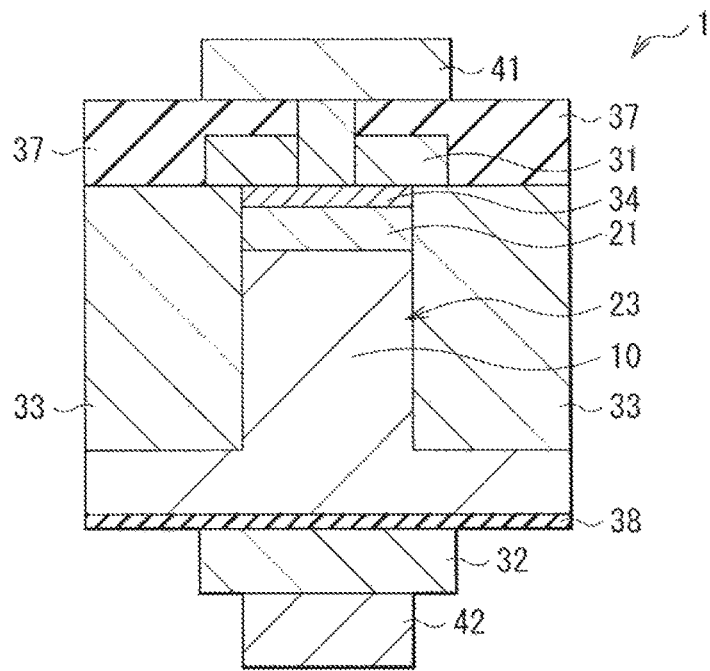

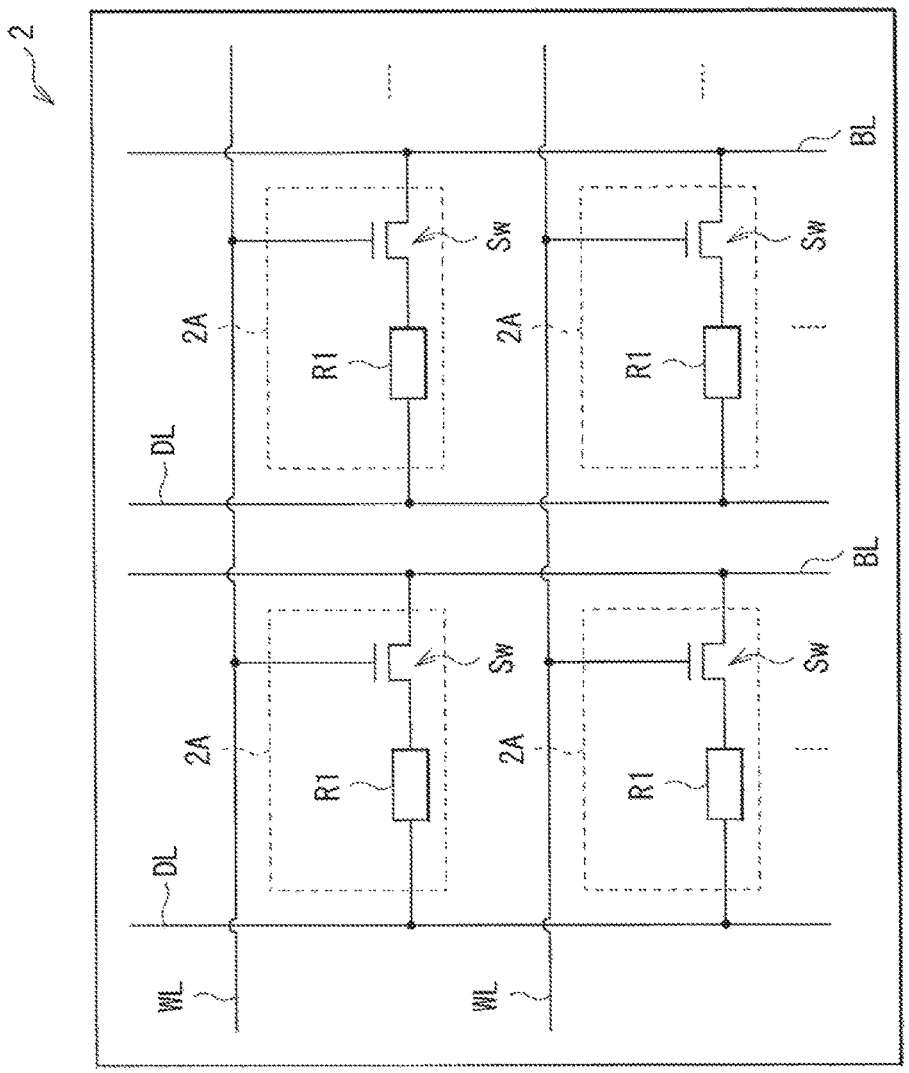
[FIG. 66]

[ FIG. 67 ]
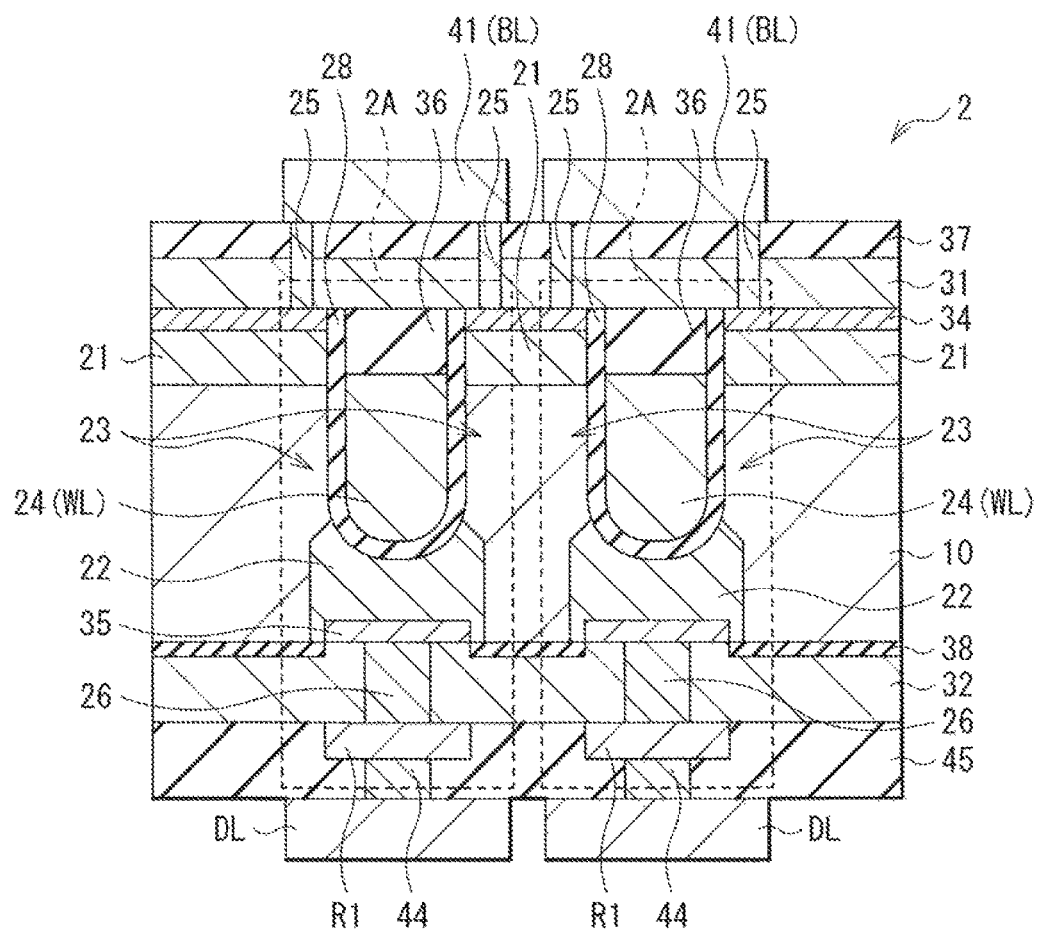

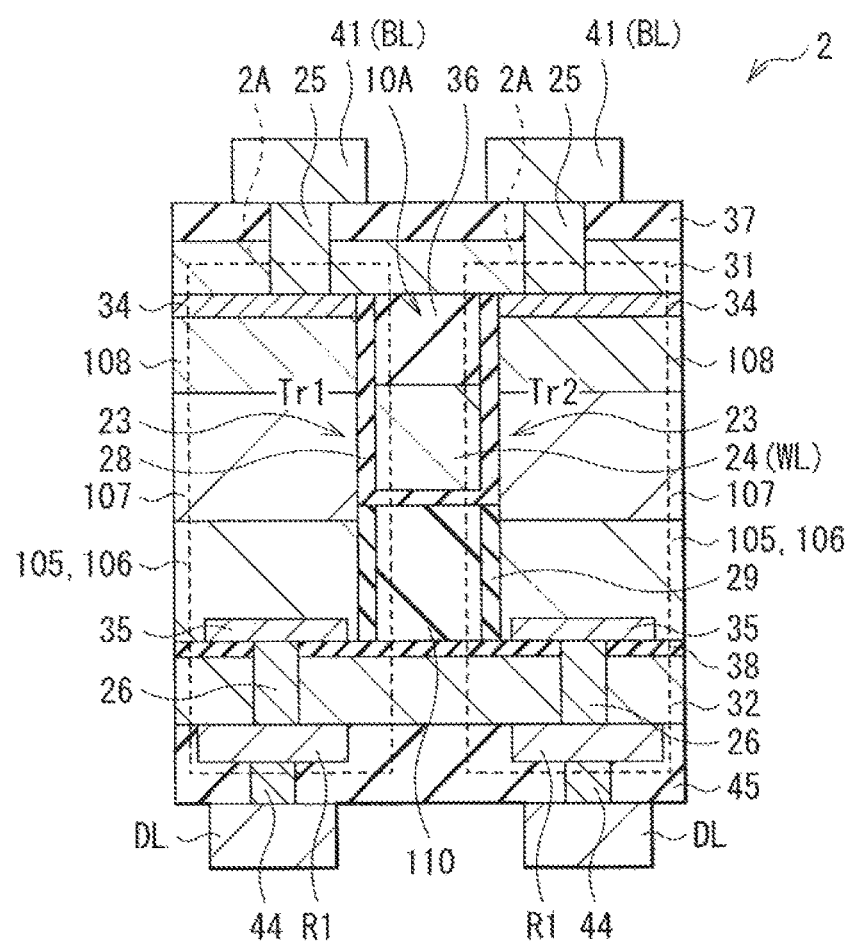
[FIG. 68]

[ FIG. 69 ]
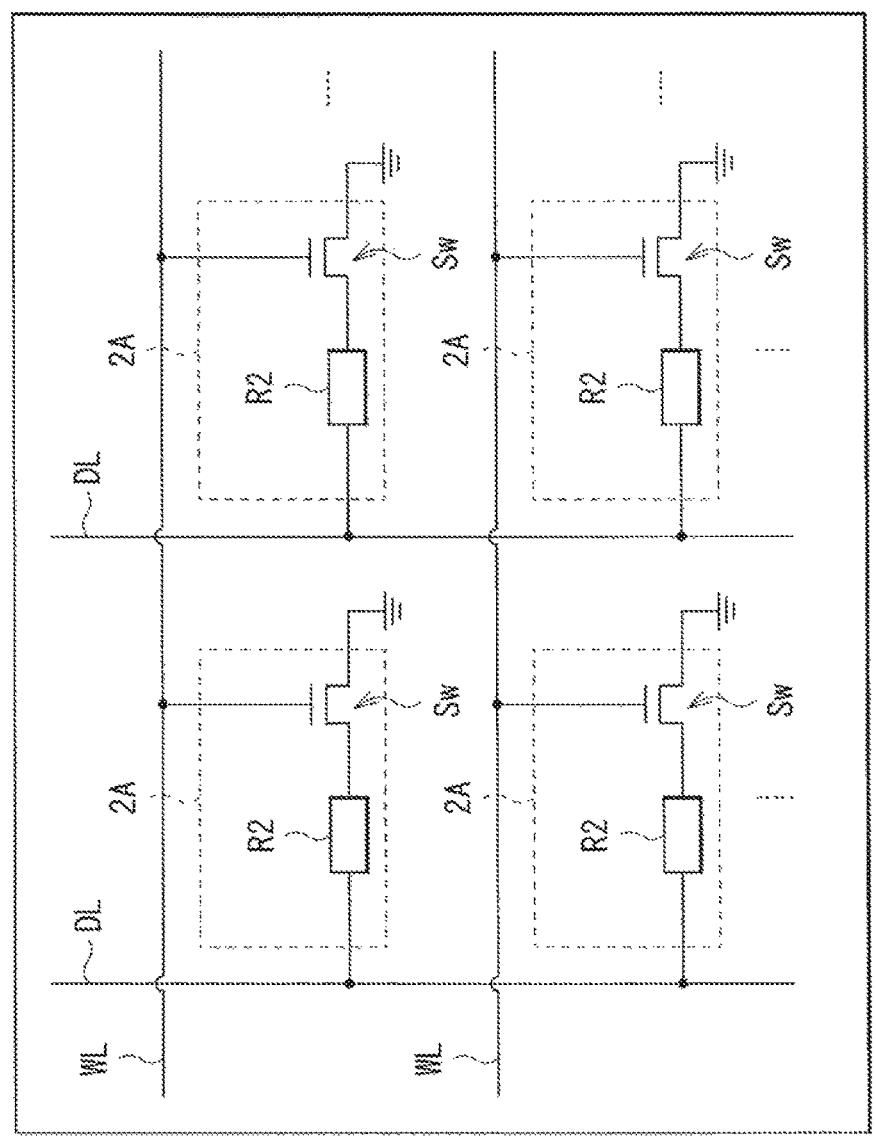

[ FIG. 70 ]
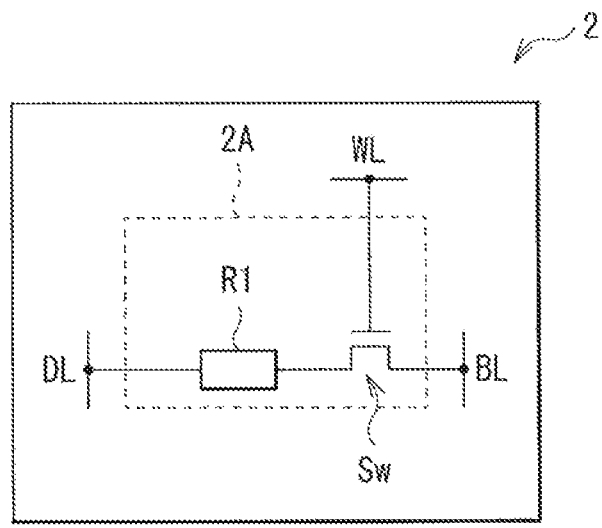
[ FIG. 71 ]
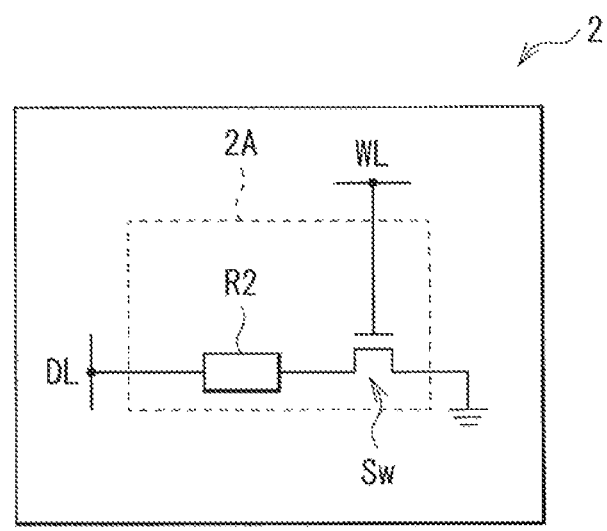

SEMICONDUCTOR DEVICE, MEMORY CIRCUIT, METHOD OF MANUFACTURING SEMICONDUCTOR DEVICE

CROSS REFERENCE TO RELATED APPLICATIONS

This application is a U.S. National Phase of International Patent Application No. PCT/JP2014/082871 filed on Dec. 11, 2014, which claims priority benefit of Japanese Patent Application No. JP 2014-001806 filed in the Japan Patent Office on Jan. 8, 2014. Each of the above-referenced applications is hereby incorporated herein by reference in its entirety.

TECHNICAL FIELD

The technology relates to a semiconductor device in which a channel of a transistor is formed in a normal direction to a substrate surface and a memory circuit including the semiconductor device. Further, the technology relates to a method of manufacturing the semiconductor device.

BACKGROUND ART

In the past, performance of LSIs has been improved with advance of technology nodes by design shrinkage in accordance with a scaling law along with Moore's Law. Although 20-nm nodes and 14-nm nodes are currently under development, it is imperative to suppress short-channel characteristics of transistors. For example, degradation of the short-channel characteristics may cause an increase in a leakage current due to subthreshold leakage during standby. The leakage current is a major issue specifically in SRAMs and other memories. In recent years, an urgent task is therefore to reduce power consumption by replacement of volatile memories with non-volatile memories, and various kinds of non-volatile memories are under development. In particular, expectations are growing for spin transfer torque-magnetic tunnel junctions (STT-MTJs) that allows for high-speed writing and reading.

For high-speed writing, it is important to improve performance of select transistors. In general, responsiveness of writing and retention characteristics are in a trade-off relationship. Accordingly, application of a transistor having high performance makes it possible to select a material having high retention characteristics as a material of the MTJs, thereby securing performance stability as memories as well.

In order to improve transistor characteristics, for example, there is proposed in Patent Literature 1 that a channel of a transistor is provided in a direction perpendicular to a substrate surface.

CITATION LIST

Patent Literature

Patent Literature 1: Japanese Unexamined Patent Application Publication No. 2004-214457

SUMMARY OF INVENTION

However, in order to address design shrinkage, further improvement is desired.

It is therefore desirable to provide a semiconductor, a memory circuit, and a method of manufacturing a semiconductor device that make it possible to cope with design shrinkage while improving transistor characteristics.

A semiconductor device according to an embodiment of the technology includes a first diffusion section, a second diffusion section, a channel section, a gate section, a first electrode section, a second electrode section, a third electrode section, and a stress application section. The first diffusion section is formed in a semiconductor layer having a groove, and is formed at or in the vicinity of a bottom of the groove. The second diffusion section is formed at an upper end of the groove in the semiconductor layer. The channel section is formed between the first diffusion section and the second diffusion section in the semiconductor layer. The gate section is buried in the groove at a position opposing the channel section. The first electrode section is electrically coupled to the first diffusion section, and is provided on rear surface side of the semiconductor layer. The second electrode section is electrically coupled to the second diffusion section, and is provided on top surface side of the semiconductor layer. The third electrode section is electrically coupled to the gate section, and is provided on the top surface side of the semiconductor layer. The stress application section is configured to apply one of compressive stress and tensile stress to the channel section in a normal direction to the semiconductor layer.

A memory circuit according to an embodiment of the technology includes a switch element and one of a non-volatile element and a volatile element. The switch element is configured to control a current flowing through one of the non-volatile element and the volatile element. The switch element includes same components as the components of the foregoing semiconductor device.

A method of manufacturing a semiconductor device according to an embodiment of the technology includes the following four steps:

(1) forming, in a semiconductor layer having a groove, a first diffusion section through the groove and forming a second diffusion section, thereby forming a channel section between the first diffusion section and second diffusion section, the first diffusion section being formed at a bottom of the groove, and the second diffusion section being formed at an upper end of the groove;

(2) forming a gate insulating film on an entire surface including an inner surface of the groove, followed by forming a gate section and removing a part protruding from the groove of the gate insulating film, the gate insulating film being made of a high-k material having a higher relative dielectric constant than a relative dielectric constant of a silicon oxide, and the gate section being made of a metal material and formed at a position opposing the channel section in the groove;

(3) forming a stress application section, the stress application section being configured to apply one of compressive stress and tensile stress to the channel section in a normal direction to the semiconductor layer; and (4) forming a first electrode section, a second electrode section, and a third electrode section, the first electrode section being provided on rear surface side of the semiconductor layer and being electrically coupled to the first diffusion section, the second electrode section being provided on top surface side of the semiconductor layer and being electrically coupled to the second diffusion section, and the third electrode section being provided on the top surface side of the semiconductor layer and being electrically coupled to the gate section.

In the semiconductor device, the memory circuit, and the method of manufacturing the semiconductor device according to the embodiments of the technology, the first diffusion section, the channel section, and the second diffusion section are disposed along the normal direction to the semiconductor layer, and a buried gate vertical transistor in which the gate section is buried in the groove is provided in the semiconductor layer. This makes it possible to improve transistor characteristics, as compared with a transistor in which all electrodes are provided on top surface side of a semiconductor layer. Moreover, the stress application section is provided. The stress application section applies one of compressive stress and tensile stress to the channel section in the normal direction to the semiconductor layer. This makes it possible to further improve the transistor characteristics. Further, the second electrode section electrically coupled to the second diffusion section and the third electrode section electrically coupled to the gate section are provided on the top surface side of the semiconductor layer, and the first electrode section electrically coupled to the first diffusion section is provided on the rear surface side of the semiconductor layer. This makes it possible to reduce occupancy area, as compared with the transistor in which all electrodes are provided on the top surface side of the semiconductor layer.

According to the semiconductor device, the memory circuit, and the method of manufacturing the semiconductor device of the embodiments of the technology, the stress application section is provided for the buried gate vertical transistor, and electrodes of the vertical transistor are provided on the top surface side and the rear surface of the semiconductor layer. This makes it possible to cope with design shrinkage while improving the transistor characteristics. Note that effects described here are non-limiting. Effects achieved by the technology may be one or more of effects described in the disclosure.

BRIEF DESCRIPTION OF DRAWINGS

FIG. 1 is a perspective view of a semiconductor device according to a first embodiment of the technology.

FIG. 2 is a cross-sectional view taken along a line A-A' of the semiconductor device in FIG. 1.

FIG. 3 is a cross-sectional view taken along a line B-B' of the semiconductor device in FIG. 1.

FIG. 4 is a cross-sectional view taken along a line C-C' of the semiconductor device in FIG. 2.

FIG. 5 is a conceptual diagram of an example of stress applied to a channel section by a stress application film provided on top surface side of a semiconductor layer.

FIG. 6 is a conceptual diagram of an example of stress applied to the channel section by a stress application film provided on rear surface side of the semiconductor layer.

FIG. 7 is a conceptual diagram of an example of stress applied to the channel section by an element isolation film.

FIG. 8 is a conceptual diagram of an example of stress applied to the channel section by the stress application films provided on the top surface side and the rear surface side of the semiconductor layer, and the element isolation film.

FIG. 9 is a conceptual diagram of an example of stress applied to the channel section by the stress application films provided on the top surface side and the rear surface side of the semiconductor layer, and the element isolation film.

FIG. 10 is a diagram of an example of a cross-sectional configuration, at a position corresponding to the line A-A' of FIG. 1, of a semiconductor substrate used in manufacture of the semiconductor device in FIG. 1.

FIG. 11 is a diagram of an example of a cross-sectional configuration, at a position corresponding to the line B-B' of FIG. 1, of the semiconductor substrate used in the manufacture of the semiconductor device in FIG. 1.

FIG. 12 is a diagram of an example of a cross-sectional configuration in a manufacturing process following FIG. 10.

FIG. 13 is a diagram of an example of a cross-sectional configuration in a manufacturing process following FIG. 12.

FIG. 14 is a diagram of an example of a cross-sectional configuration in a manufacturing process following FIG. 13.

FIG. 15 is a diagram of an example of a cross-sectional configuration in a manufacturing process following FIG. 14.

FIG. 16 is a diagram of an example of a cross-sectional configuration in a manufacturing process following FIG. 15.

FIG. 17 is a diagram of an example of a cross-sectional configuration in a manufacturing process following FIG. 16.

FIG. 18 is a diagram of an example of a cross-sectional configuration in a manufacturing process following FIG. 17.

FIG. 19 is a diagram of an example of a cross-sectional configuration in a manufacturing process following FIG. 18.

FIG. 20 is a diagram of an example of a cross-sectional configuration in a manufacturing process following FIG. 19.

FIG. 21 is a diagram of an example of a cross-sectional configuration in a manufacturing process following FIG. 20.

FIG. 22 is a diagram of an example of a cross-sectional configuration in a manufacturing process following FIG. 21.

FIG. 23 is a diagram of an example of a cross-sectional configuration, at the position corresponding to the line A-A' of FIG. 1, of the semiconductor substrate used in the manufacture of the semiconductor device in FIG. 1.

FIG. 24 is a diagram of an example of a cross-sectional configuration in a manufacturing process following FIG. 23.

FIG. 25 is a diagram of an example of a cross-sectional configuration in a manufacturing process following FIG. 24.

FIG. 26 is a diagram of an example of a cross-sectional configuration in a manufacturing process following FIG. 25.

FIG. 27 is a diagram of an example of a cross-sectional configuration in a manufacturing process following FIG. 26.

FIG. 28 is a diagram of an example of a cross-sectional configuration, at the position corresponding to the line A-A' of FIG. 1, of the semiconductor substrate used in the manufacture of the semiconductor device in FIG. 1.

FIG. 29 is a diagram of an example of a cross-sectional configuration in a manufacturing process following FIG. 28.

FIG. 30 is a diagram of an example of a cross-sectional configuration in a manufacturing process following FIG. 29.

FIG. 31 is a diagram of an example of a cross-sectional configuration, at the position corresponding to the line A-A' of FIG. 1, of the semiconductor substrate used in the manufacture of the semiconductor device in FIG. 1.

FIG. 32 is a diagram of an example of a cross-sectional configuration in a manufacturing process following FIG. 31.

FIG. 33 is a diagram of an example of a cross-sectional configuration in a manufacturing process following FIG. 32.

FIG. 34 is a diagram of an example of a cross-sectional configuration in a manufacturing process following FIG. 33.

FIG. 35 is a diagram of an example of a cross-sectional configuration in a manufacturing process following FIG. 34.

FIG. 36 is a diagram of an example of a cross-sectional configuration in a manufacturing process following FIG. 35.

FIG. 37 is a diagram of an example of a cross-sectional configuration, at the position corresponding to the line A-A' of FIG. 1, of the semiconductor substrate used in the manufacture of the semiconductor device in FIG. 1.

FIG. 38 is a diagram of an example of a cross-sectional configuration in a manufacturing process following FIG. 37.

FIG. 39 is a diagram of a modification example of the semiconductor device in FIG. 36.

FIG. 40 is a diagram of an example of a cross-sectional configuration, at a position corresponding to the line A-A' of FIG. 1, of the semiconductor substrate used in manufacture of the semiconductor device in FIG. 39.

FIG. 41 is a diagram of an example of a cross-sectional configuration in a manufacturing process following FIG. 40.

FIG. 42 is a diagram of an example of a cross-sectional configuration in a manufacturing process following FIG. 41.

FIG. 43 is a diagram of an example of a cross-sectional configuration in a manufacturing process following FIG. 42.

FIG. 44 is a diagram of an example of a cross-sectional configuration, at the position corresponding to the line A-A' of FIG. 1, of the semiconductor substrate used in the manufacture of the semiconductor device in FIG. 39.

FIG. 45 is a diagram of an example of a cross-sectional configuration in a manufacturing process following FIG. 44.

FIG. 46 is a diagram of a modification example of the semiconductor device in FIG. 39.

FIG. 47 is a diagram of a modification example of the semiconductor device in FIG. 46.

FIG. 48 is a diagram of a modification example of the semiconductor device in FIG. 3.

FIG. 49 is a diagram of a modification example of the semiconductor device in FIG. 4.

FIG. 50 is a diagram of a modification example of the semiconductor device in FIG. 4.

FIG. 51 is a diagram of a modification example of the semiconductor device in FIG. 2.

FIG. 52 is a diagram of a modification example of the semiconductor device in FIG. 36.

FIG. 53 is a diagram of a modification example of the semiconductor device in FIG. 39.

FIG. 54 is a diagram of a modification example of the semiconductor device in FIG. 46.

FIG. 55 is a diagram of a modification example of the semiconductor device in FIG. 2.

FIG. 56 is a diagram of a modification example of the semiconductor device in FIG. 36.

FIG. 57 is a diagram of a modification example of the semiconductor device in FIG. 39.

FIG. 58 is a diagram of a modification example of the semiconductor device in FIG. 46.

FIG. 59 is a diagram of a modification example of the semiconductor device in FIG. 2.

FIG. 60 is a diagram of a modification example of the semiconductor device in FIG. 36.

FIG. 61 is a diagram of a modification example of the semiconductor device in FIG. 39.

FIG. 62 is a diagram of a modification example of the semiconductor device in FIG. 46.

FIG. 63 is a diagram of a modification example of the semiconductor device in FIG. 1.

FIG. 64 is a diagram of a modification example of the semiconductor device in FIG. 2.

FIG. 65 is a diagram of a modification example of the semiconductor device in FIG. 4.

FIG. 66 is a diagram of an example of a circuit configuration of a memory circuit according to a second embodiment of the technology.

FIG. 67 is a diagram of an example of a cross-sectional configuration of the memory circuit in FIG. 66.

FIG. 68 is a diagram of an example of the cross-sectional configuration of the memory circuit in FIG. 66.

FIG. 69 is a diagram of a modification example of the circuit configuration of the memory circuit in FIG. 66.

FIG. 70 is a diagram of a modification example of the circuit configuration of the memory circuit in FIG. 66.

FIG. 71 is a diagram of a modification example of the circuit configuration of the memory circuit in FIG. 69.

MODE FOR CARRYING OUT THE INVENTION

Some embodiments of the technology are described in detail below with reference to drawings. Note that description is given in the following order.
1. First Embodiment (Semiconductor Device)
2. Modification Examples of First Embodiment (Semiconductor Device)
3. Second Embodiment (Memory Circuit)
4. Modification Examples of Second Embodiment (Memory Circuit)

1. First Embodiment

[Configuration]
FIG. 1 illustrates a perspective configuration of a semiconductor device 1 according to a first embodiment of the technology. FIG. 2 illustrates an example of a cross-sectional configuration taken along a line A-A' of FIG. 1 of the semiconductor device 1. FIG. 3 illustrates an example of a cross-sectional configuration taken along a line B-B' of FIG. 1 of the semiconductor device 1. FIG. 4 illustrates an example of a cross-sectional configuration taken along a line C-C' of FIG. 2 of the semiconductor device 1. The semiconductor device 1 includes a semiconductor layer 10 and a transistor 20 that is formed in the semiconductor layer 10.
(Transistor 20)
The transistor 20 is a buried gate vertical transistor. The transistor 20 may be a p-type MOS transistor or an n-type MOS transistor. The transistor 20 includes two source-drain sections 21, a source-drain section 22, a channel section 23, a gate section 24, an electrode section 25, an electrode section 26, an electrode section 27, and a gate insulating film 28. It is to be noted that the source-drain section 21 corresponds to a specific example of "second diffusion section" in the technology. The source-drain section 22 corresponds to a specific example of "first diffusion section" in the technology. The channel section 23 corresponds to a specific example of "channel section" in the technology. The gate section 24 corresponds to a specific example of "gate section" in the technology. The electrode section 25 corresponds to a specific example of "second electrode section" in the technology. The electrode section 26 corresponds to a specific example of "first electrode section" in the technology. The electrode section 27 corresponds to a specific example of "third electrode section" in the technology.

The semiconductor layer 10 is a silicon layer. In a case in which the transistor 20 is the p-type MOS transistor, the semiconductor layer 10 is an n-type silicon layer. In a case in which the transistor 20 is the n-type MOS transistor, the semiconductor layer 10 is a p-type silicon layer. At this occasion, the semiconductor layer 10 may be a bulk silicon substrate or an SOI (Silicon on Insulator) substrate in which a silicon layer is isolated. It is to be noted that, in the following, description is given of a case in which the semiconductor layer 10 is the SOI substrate in which the silicon layer is isolated; however, the semiconductor layer 10 is not limited to the SOI substrate in which the silicon layer is isolated.

The semiconductor layer 10 includes a groove 10A on top surface side thereof. The groove 10A is formed by etching the semiconductor layer 10. The groove 10A has a depth that does not penetrate the semiconductor layer 10, and a bottom surface of the groove 10A and a rear surface of the semiconductor layer 10 have a predetermined gap therebetween. The gate insulating film 28 is formed on an inner surface of the groove 10A, and is formed on two side surfaces opposing each other in the inner surface of the groove 10A. The gate insulating film 28 is formed at positions opposing the channel section 23 on the side surfaces of the groove 10A. The gate insulating film 28 may be made of, for example, a silicon oxide, e.g., $SiO_2$ or SiON. It is to be noted that the gate insulating film 28 may be made of a high-k material having a higher relative dielectric constant than the silicon oxide. Examples of the above-described high-k material may include insulating materials having a high dielectric constant such as $HfO_2$ and $ZrO_2$. In a case in which the gate insulating film 28 is made of the above-described high-k material, it is possible to reduce a gate leakage current while increasing insulating film capacity (that is, reducing a thickness of the gate insulating film 28). The source-drain section 22 is formed at a bottom of the groove 10A, and is formed between the bottom surface of the groove 10A and the rear surface of the semiconductor layer 10. In the case in which the transistor 20 is the p-type MOS transistor, the source-drain section 22 is a p-type semiconductor region. In the case in which the transistor 20 is the n-type MOS transistor, the source-drain section 22 is an n-type semiconductor region.

The two source-drain sections 21 are formed at upper ends of the two side surfaces opposing each other in the inner surface of the groove 10A (at an upper end of the groove 10A) in the semiconductor layer 10. In the case in which the transistor 20 is the p-type MOS transistor, the two source-drain sections 21 are p-type semiconductor regions. In the case in which the transistor 20 is the n-type MOS transistor, the two source-drain sections 21 are n-type semiconductor regions.

The channel section 23 is formed on the above-described two side surfaces in the semiconductor layer 10, and is formed between each of the source-drain sections 21 and the source-drain section 22. The channel section 23 is a strip-shaped region extending in a thickness direction of the semiconductor layer 10. In a case in which the source-drain sections 21 and 22, and the channel section 23 constitute a p-type transistor, for example, the channel section 23 may be formed on a (110) plane, and may have a channel orientation of <110>. The channel orientation indicates a direction of a current flowing through the channel section 23. At this occasion, the semiconductor layer 10 may be a (110) layer or a (110) substrate. Note that in the case in which the source-drain sections 21 and 22, and the channel section 23 constitute the p-type transistor, for example, the channel section 23 may be formed on the (110) plane, and may have a channel orientation of <100>. At this occasion, the semiconductor layer 10 may be a (100) layer or a (100) substrate. In a case in which the source-drain sections 21 and 22, and the channel section 23 constitute an n-type transistor, for example, the channel section 23 may be formed on a (001) plane and may have a channel orientation of <110>. At this occasion, the semiconductor layer 10 may be a (110) layer or a (110) substrate.

The gate section 24 is buried at a position opposing the channel section 23 inside the groove 10A. The gate section 24 extends in a direction parallel to the two side surfaces opposing each other (or the channel section 23) in the groove 10A. A top surface of the gate section 24 is formed at a lower position than the upper end of the groove 10A, and a level difference is caused between the top surface of the gate section 24 and a top surface of each of the source-drain sections 21. An insulating layer 36 is so provided as to eliminate the level difference. The gate section 24 may be made of, for example, polysilicon or a metal. In a case in which the gate insulating film 28 is made of the silicon oxide, the gate section 24 may be made of, for example, polysilicon. In the case in which the gate insulating film 28 is made of the above-described high-k material, the gate section 24 may be made of the metal.

The electrode section 25 is electrically coupled to the source-drain sections 21, and is provided on the top surface side of the semiconductor layer 10. The electrode section 25 may have a contact hole shape, for example. The electrode section 25 may be buried in an insulating layer 37, for example. A wiring layer 41 is provided on the insulating layer 37. The wiring layer 41 is electrically coupled to the electrode section 25. A conductive layer 34 is provided between the electrode section 25 and each of the source-drain sections 21. The conductive layer 34 may be made of, for example, silicide (e.g., NiSi).

The electrode section 26 is electrically coupled to the source-drain section 22, and is provided on the rear surface side of the semiconductor layer 10. The electrode section 26 may have a columnar shape. An insulating layer 38 is provided on the rear surface side of the semiconductor layer 10. The insulating layer 38 includes an aperture at a position opposing the source-drain section 22. A rear surface of the source-drain section 22 is exposed to a bottom surface of the aperture of the insulating layer 38, and a wiring layer 42 is electrically coupled to the source-drain section 22 through the aperture of the insulating layer 38. A conductive layer 35 is provided between the electrode section 26 and the source-drain section 22. The conductive layer 35 may be made of, for example, silicide (e.g., NiSi).

The electrode section 27 is electrically coupled to the gate section 24, and is provided on the top surface side of the semiconductor layer 10. The electrode section 27 may have a contact hole shape or a slit shape, for example. The electrode section 27 may be buried in the insulating layer 37, for example. A wiring layer 43 is provided on the insulating layer 37. The wiring layer 43 is electrically coupled to the electrode section 27.

The semiconductor device 1 further includes a stress application section. The stress application section is configured to apply one of compressive stress and tensile stress to the channel section 23 in a normal direction to the semiconductor layer 10 (a longitudinal direction of the channel section 23). The semiconductor device 1 may include a stress application film 31, a stress application film 32, and an element isolation film 33 as the stress application sections. The stress application film 31 and the stress application film 32 are so disposed as to interpose the channel section 23 from above and below (an extending direction of the channel section 23). The element isolation film 33 is so disposed as to interpose the channel section 23 from a width direction of the channel section 23. It is to be noted that the stress application film 31 corresponds to a specific example of "first stress application film" in the technology. The stress application film 32 corresponds to a specific example of "second stress application film" in the technology. The element isolation film 33 corresponds to a specific example of "third stress application film" in the technology.

The stress application film 31 is provided on the top surface side of the semiconductor layer 10. More specifically, the stress application film 31 is provided in contact with the top surfaces of the two source-drain sections 21, and extends in a direction orthogonal to an extending direction of the gate section 24. A width of the stress application film 31 is larger than a width of the source-drain section 21. For example, the stress application film 31 may be a tensile film, and may be configured to apply compressive stress to the channel section 23, as illustrated in FIG. 5.

The stress application film 32 is provided on the rear surface side of the semiconductor layer 10. More specifically, the stress application film 32 is provided at a position opposing the rear surface of the source-drain section 22, and extends in a direction orthogonal to the extending direction of the gate section 24. A width of the stress application film 32 is larger than a width of the source-drain section 22. For example, the stress application film 32 may be a tensile film, and may be configured to apply compressive stress to the channel section 23, as illustrated in FIG. 6.

The element isolation film 33 is provided on both sides of the channel section 23. The element isolation film 33 is configured to electrically isolate the transistor 20 from other elements formed in the semiconductor layer 10. The element isolation film 33 is formed by STI (shallow trench isolation). For example, the element isolation film 33 may be a tensile film, and may be configured to apply compressive stress to the channel section 23, as illustrated in FIG. 7. As described above, each of the stress application film 31, the stress application film 32, and the element isolation film 33 may be a tensile film, and may be configured to apply compressive stress to the channel section 23, for example, as illustrated in FIG. 8.

It is to be noted that each of the stress application film 31, the stress application film 32, and the element isolation film 33 may be a compressive film. In this case, the stress application film 31, the stress application film 32, and the element isolation film 33 may be configured to apply tensile stress to the channel section 23, for example, as illustrated in FIG. 9.

In a case in which the source-drain sections 21 and 22, and the channel section 23 constitute the p-type transistor, and the channel section 23 is formed on the (110) plane and has the channel orientation of <110>, the stress application sections are tensile films, and are configured to apply compressive stress to the channel section 23. Alternatively, in a case in which the source-drain sections 21 and 22, and the channel section 23 constitute the p-type transistor, and the channel section 23 is formed on the (110) plane and has the channel orientation of <100>, the stress application sections are compressive films, and are configured to apply tensile stress to the channel section 23. Alternatively, in a case in which the source-drain sections 21 and 22, and the channel section 23 constitute the n-type transistor, and the channel section 23 is formed on the (001) plane and has the channel orientation of <110>, the stress application sections are compressive films, and are configured to apply tensile stress to the channel section 23. In the embodiment, mobility is maximized by setting a formation plane and the channel orientation of the channel section 23 as described above. Moreover, in the embodiment, transistor characteristics are further improved by configuring the stress application sections as described above, in addition to setting the formation plane and the channel orientation of the channel section 23 as described above.

[Manufacturing Method]

In the following, description is given of an example of a method of manufacturing the semiconductor device 1 according to the embodiment. FIGS. 10 to 22 illustrate examples of processes of manufacturing the semiconductor device 1 in order. It is to be noted that FIG. 10 and FIGS. 12 to 22 are cross-sectional views at a position corresponding to the line A-A' of FIG. 1. FIG. 11 is a cross-sectional view at a position corresponding to the line C-C' of FIG. 2.

First, a semiconductor substrate 100 is prepared (see FIG. 10). The semiconductor substrate 100 is an SOI substrate in which the insulating layer 38 made of $SiO_2$ is provided between a semiconductor layer 101 and the semiconductor layer 10. First, the element isolation film 33 is provided on the semiconductor layer 10 of the semiconductor substrate 100 (see FIG. 11). More specifically, a pair of the element isolation films 33 are provided at positions opposing each other with a position where the source-drain section 21 is to be formed in between.

Next, an insulating layer 102 having a strip-shaped aperture is formed on the top surface of the semiconductor layer 10. The strip-shaped aperture crosses the pair of the element isolation film 33. Thereafter, the semiconductor layer 10 and the pair of the element isolation films 33 are selectively etched with use of the insulating layer 102 as a mask to form the groove 10A (see FIG. 12). The gate insulating film 28 is then formed on the inner surface of the groove 10A. More specifically, the gate insulating film 28 is formed on two side surfaces opposing each other in the inner surface of the groove 10A (see FIG. 13), and thereafter, the source-drain section 22 is formed at the bottom of the groove 10A through the groove 10A (see FIG. 14). Next, the gate section 24 is so formed as to be buried in the groove 10A (see FIG. 15). Thereafter, the insulating layer 36 is so formed as to eliminate the level difference between the top surface of the gate section 24 and the top surface of the semiconductor layer 10 (see FIG. 16). Next, the insulating layer 102 is removed. The source-drain sections 21 are then formed at the upper end of the groove 10A. More specifically, one of the source-drain sections 21 is formed at each of the upper ends of the two side surfaces opposing each other in the inner surface of the groove 10A (at the upper end of the groove 10A) (see FIG. 17). Thus, the channel section 23 is formed between the source-drain section 22 and each of the source-drain sections 21 (more specifically, at a position opposing the gate section 24). Thereafter, the conductive layer 34 is formed on the tops of the two source-drain sections 21 (see FIG. 18).

Next, the stress application film 31 is formed at a position in contact with the top surfaces of the two source-drain sections 21, and thereafter, the insulating layer 37 is formed on an entire top surface including the stress application film 31 (see FIG. 19). Next, an aperture is formed in a region of the stress application film 31 and the insulating layer 37. The region opposes the top surface of each of the source-drain sections 21. The electrode section 25 is formed in the aperture, and the wiring layer 41 is formed at a position including a top surface of the electrode section 25 (see FIG. 20). Moreover, another aperture is formed in a region of the stress application film 31 and the insulating layer 37. The region opposes the top surface of the gate section 24. The electrode section 27 is formed in the aperture, and the wiring layer 43 is formed at a position including the top surface of the electrode section 27 (not illustrated).

Next, the semiconductor layer 101 is removed (see FIG. 21). Thereafter, an aperture is formed at a position opposing the source-drain section 22 of the insulating layer 38, and the conductive layer 35 is formed on the source-drain section 22 through the aperture (see FIG. 22). Then, the stress application film 32, the electrode section 26, and the wiring layer 42 are formed (see FIG. 2). Thus, the semiconductor device 1 according to the embodiment is manufactured.

The above-described manufacturing method is suitable for a case in which the gate insulating film 28 is made of the silicon oxide. In the following, description is given of a suitable manufacturing method for a case in which the gate insulating film 28 is made of the above-described high-k material. FIGS. 23 to 27 illustrate another example of the processes of manufacturing the semiconductor device 1 in order. It is to be noted that FIGS. 23 to 27 are cross-sectional views at the position corresponding to the line A-A' of FIG. 1.

First, the groove 10A is formed in the semiconductor layer 10 by the same processes as the processes illustrated in FIGS. 10 to 12. Next, an insulating film 28a is formed on the inner surface of the groove 10A. The insulating film 28a is similar to the gate insulating film 28. More specifically, the insulating film 28a that is similar to the gate insulating film 28 is formed on two side surfaces opposing each other in the inner surface of the groove 10A (see FIG. 23). Then, the source-drain section 22 is formed at the bottom of the groove 10A through the groove 10A. Moreover, the source-drain sections 21 are formed at the upper end of the groove 10A. More specifically, one of the source-drain sections 21 is formed at each of the upper ends of the two side surfaces opposing each other in the groove 10A (at the upper end of the groove 10A) (see FIG. 24). Thus, the channel section 23 is formed between the source-drain section 22 and each of the source-drain sections 21.

Next, the insulating film 28a is removed. Thereafter, the gate insulating film 28 made of the above-described high-k material is formed on an entire surface including the inner surface of the groove 10A (see FIG. 25). Then, the gate section 24 made of a metal material is so formed as to be buried in the groove 10A (see FIG. 26). Next, the insulating layer 36 is so formed as to eliminate the level difference between the top surface of the gate section 24 and the top surface of the semiconductor layer 10 (see FIG. 26). Thereafter, the insulating layer 102 and a part of the gate insulating film 28 are removed (see FIG. 27). The part of the gate insulating film 28 protrudes from the groove 10A. Next, the conductive layer 34, the stress application film 31, the insulating layer 37, the electrode section 25, the wiring layer 41, the electrode section 27, and the wiring layer 43 are formed by a method similar to the above-described manufacturing method (refer to FIGS. 18 to 20). Thereafter, by a method similar to the above-described manufacturing method, the semiconductor layer 101 is removed, and the conductive layer 35 is formed (refer to FIGS. 21 and 22). Lastly, the stress application film 32, the electrode section 26, and the wiring layer 42 are formed by a method similar to the above-described manufacturing method (refer to FIG. 2). The semiconductor device 1 according to the embodiment is manufactured even in this way.

[Operation]

In the following, description is given of operation of the semiconductor device 1 according to the embodiment. In the embodiment, when a voltage is applied to the electrode sections 25 and 26 through the wiring layers 41 and 42, and a potential difference between the electrode sections 25 and 26 exceeds a threshold value, the transistor 20 is turned on, and a current flows in a stacking direction, for example, as illustrated in FIG. 2. Moreover, when application of the voltage to the electrode sections 25 and 26 is stopped, and the potential difference between the electrode sections 25 and 26 falls below the threshold value, the transistor 20 is turned off, and the current does not flow.

[Effects]

In the following, description is given of effects of the semiconductor device 1 according to the embodiment.

In the embodiment, the buried gate vertical transistor is provided in the semiconductor layer 10. In the buried gate vertical transistor, the source-drain section 22, the channel section 23, and the source-drain sections 21 are disposed along the normal direction to the semiconductor layer 10, and the gate section 24 is buried in the groove 10A. Accordingly, as compared with a transistor in which all electrodes are provided on top surface side of a semiconductor layer, a channel length and a channel width are easily increased, which makes it possible to improve the transistor characteristics. Moreover, the stress application section is provided. The stress application section applies one of compressive stress and tensile stress to the channel section 23 in the normal direction to the semiconductor layer 10. This makes it possible to further improve the transistor characteristics. Further, the electrode section 25 electrically coupled to the source-drain section 21, and the electrode section 27 electrically coupled to the gate section 24 are provided on the top surface side of the semiconductor layer 10, and the electrode section 26 electrically coupled to the source-drain section 22 is provided on the rear surface side of the semiconductor layer 10. This makes it possible to reduce occupancy area, as compared with the transistor in which all electrodes are provided on the top surface side of the semiconductor layer. Accordingly, it is possible to cope with design shrinkage while improving the transistor characteristics.

2. Modification Examples of First Embodiment

In the following, description is given of modification examples of the semiconductor device 1 according to the foregoing embodiment. It is to be noted that same component as the components of the semiconductor device 1 according to the foregoing embodiment are denoted by same reference numerals. Further, description of the same components as the components of the semiconductor device 1 according to the foregoing embodiment are omitted as appropriate.

Modification Example 1

In the foregoing embodiment, the source-drain section 22 is formed in the semiconductor layer 10 through the bottom surface of the groove 10A. However, adoption of the following method may make it possible to form the groove 10A after forming the source-drain section 22 in the semiconductor layer 10.

First, for example, before forming the groove 10A, a source-drain section 103 is formed close to the rear surface of the semiconductor layer 10 by, for example, an ion implantation method, as illustrated in FIG. 28. Next, for example, an isolation layer 104 having a different conductive type from a conductive type of the source-drain section 103 is formed at a position in the source-drain section 103 other than a position where the source-drain section 22 is to be formed by, for example, an ion implantation method, as illustrated in FIG. 29. Consequently, the remaining source-drain section 103 serves as the source-drain section 22. Next, for example, the groove 10A having a depth that reaches the source-drain section 22 is formed, as illustrated in FIG. 30. Thereafter, the semiconductor device 1 is manufactured by the similar processes to the processes described in the foregoing embodiment.

Modification Example 2

In the foregoing embodiment, the semiconductor layer 10 may be formed by epitaxial crystal growth. FIGS. 31 to 36 illustrate an example of processes of manufacturing the semiconductor device 1 according to this modification example in order. It is to be noted that FIGS. 31, 32, and 34 to 36 are cross-sectional views at a position corresponding to the line A-A' of FIG. 1. FIG. 33 is a cross-sectional view at a position corresponding to the line C-C' of FIG. 2.

First, a semiconductor substrate 200 is prepared (see FIG. 31). In the semiconductor substrate 200, the insulating layer 38 is provided between the semiconductor layer 101 and a semiconductor layer 105. Next, the epitaxial crystal growth is performed to form semiconductor layers 106, 107, and 108 in this order on the semiconductor layer 105 (see FIG. 32). At this occasion, the semiconductor layers 105, 106, and 108 have a different conductive type from a conductive type of the semiconductor layer 107.

Next, the pair of the element isolation films 33 are formed on the semiconductor layers 105, 106, 107, and 108 (see FIG. 33). At this occasion, the pair of the element isolation films 33 are formed by a similar method to the manufacturing method in the foregoing embodiment. Then, an isolation layer 109 having a different conductive type from the conductive type of the semiconductor layers 105 and 106 is formed, by, for example, an ion implantation method, at a position in the semiconductor layers 105 and 106 other than a position where the source-drain section 22 is to be formed (see FIG. 34). Accordingly, the remaining semiconductor layers 105 and 106 serve as the source-drain section 22.

Next, the insulating layer 102 having an aperture at a predetermined position is formed on a top surface, and thereafter, the semiconductor layer 10 is selectively etched with use of the insulating layer 102 as a mask to form the groove 10A (see FIG. 35). At this occasion, the groove 10A is so formed as to allow the source-drain section 22 to serve as the bottom of the groove 10A. Thereafter, the semiconductor device 1 having, for example, a cross-sectional configuration as illustrated in FIG. 36 is manufactured by processes similar to the processes described in the foregoing embodiment.

Modification Example 3

In the foregoing embodiment, the source-drain sections 21 and 22 may be formed on the semiconductor layer 10 by epitaxial crystal growth. FIGS. 37 and 38 illustrate an example of processes of manufacturing the semiconductor device 1 according to this modification example in order. It is to be noted that FIGS. 37 and 38 are cross-sectional views at a position corresponding to the line A-A' of FIG. 1.

First, the groove 10A is formed in the semiconductor layer 10 (see FIG. 37). Next, epitaxial crystal growth is performed on an entire top surface including the groove 10A of the semiconductor layer 10 to stack a semiconductor layer. As a result, the source-drain section 22 is formed at the bottom of the groove 10A, and the source-drain section 21 is formed in parts other than the groove 10A of the top surface of the semiconductor layer 10 (see FIG. 38). Thereafter, the gate section 24 and the insulating layer 36 are formed inside the groove 10A. Then, processes similar to the processes described in the foregoing embodiment are performed to manufacture the semiconductor device 1.

In the manufacturing method according to this modification example, the source-drain sections 21 and 22 are formed by one-time epitaxial crystal growth. Hence, it is possible to form the source-drain sections 21 and 22 extremely easily, as compared with the manufacturing method according to the foregoing embodiment.

Modification Example 4

In the foregoing embodiment and the modification examples (the modification examples 1 to 3) of the foregoing embodiment, the semiconductor device 1 includes two channel sections 23 for one source-drain section 22. However, the semiconductor device 1 may include, for example, two source-drain sections 22, and one of the channel sections 23 may be provided for each of the source-drain sections 22.

FIG. 39 illustrates an example of a cross-sectional configuration of the semiconductor device 1 according to this modification example. FIG. 39 corresponds to a cross-section at a position corresponding to the line A-A' of FIG. 1 of the semiconductor device 1 according to this modification example. The semiconductor device 1 illustrated in FIG. 39 corresponds to the semiconductor device 1 in which the isolation layer 109 is not formed in the manufacturing processes in the modification example 2, and the groove 10A is so formed as to penetrate the semiconductor layers 105, 106, 107, and 108, thereby separating each of the semiconductor layers 105, 106, 107, and 108 into two parts.

The semiconductor device 1 illustrated in FIG. 39 may include two semiconductor layers 105 corresponding to the source-drain section 22 in the vicinity of the bottom of the groove 10A. More specifically, the semiconductor device 1 illustrated in FIG. 39 may include the two semiconductor layers 105, of which one is provided in each of two regions opposing each other with the bottom of the groove 10A in between. Moreover, the semiconductor device 1 illustrated in FIG. 39 may include two semiconductor layers 106 corresponding to the source-drain section 22 in the vicinity of the bottom of the groove 10A. More specifically, the semiconductor device 1 illustrated in FIG. 39 may include the two semiconductor layers 106, of which one is provided in each of two regions opposing each other with the bottom of the groove 10A in between. Further, the semiconductor device 1 illustrated in FIG. 39 may include two semiconductor layers 108 corresponding to the source-drain sections 21 at the upper end of the groove 10A. More specifically, the semiconductor device 1 illustrated in FIG. 39 may include the two semiconductor layers 108, of which one is provided in each of two regions opposing each other with the top of the groove 10A in between. Furthermore, the semiconductor device 1 illustrated in FIG. 39 may include two semiconductor layers 107 each including the channel section 23. More specifically, the semiconductor device 1 illustrated in FIG. 39 may include the two semiconductor layers 107, of which one is provided in each of two regions opposing each other with the groove 10A in between. Each of the semiconductor layers 107 may be provided between the semiconductor layer 106 and the semiconductor layer 108. Accordingly, the semiconductor device 1 illustrated in FIG. 39 may include two stacking bodies in which the semiconductor layers 105, 106, 107, and 108 are stacked in this order in two regions opposing each other with the groove 10A in between. The two stacking bodies are each provided for corresponding one of the two regions.

Moreover, the semiconductor device 1 illustrated in FIG. 39 may include one gate section 24 in the groove 10A. The one gate section 24 may be shared by two channel sections 23 provided on both sides of the groove 10A. Hence, in the semiconductor device 1 illustrated in FIG. 39, the transistor 20 may be configured of two transistors Tr1 and Tr2 that share the one gate section 24.

The semiconductor device 1 illustrated in FIG. 39 may include an insulating layer 110 and an insulating layer 29. The insulating layer 110 may be buried in the groove 10A on bottom side. The insulating layer 29 may be provided between the insulating layer 110 and side surfaces of the semiconductor layers 105 and 106. The top surfaces of the insulating layer 110 and the insulating layer 29 may be located in the same plane as a boundary surface between the semiconductor layer 106 and the semiconductor layer 107 or at a position higher than the boundary surface. The semiconductor device 1 illustrated in FIG. 39 may further include the gate section 24. The gate section 24 may be buried in the groove 10A at a position opposing the channel section 23. The gate section 24 may be formed on the insulating layer 110. The position of a bottom surface of the gate section 24 may be specified by positions of the top surfaces of the insulating layer 110 and the insulating layer 29. The top surface of the gate section 24 may be formed at a lower position than the upper end of the groove 10A, and may be located in the same plane as a boundary surface between the semiconductor layer 107 and the semiconductor layer 108 or at a lower position than the boundary surface, for example. A level difference is caused between the top surface of the gate section 24 and the top surface of the semiconductor layer 108. The insulating layer 36 may be so provided as to eliminate the level difference. In the semiconductor device 1 illustrated in FIG. 39, one electrode section 25 and one electrode section 26 may be provided for the transistor Tr1, and one electrode section 25 and one electrode section 26 are provided for the transistor Tr2.

[Manufacturing Method]

In the following, description is given of a method of manufacturing the semiconductor device 1 illustrated in FIG. 39. FIGS. 40 to 43 illustrate an example of processes of manufacturing the semiconductor device 1 illustrated in FIG. 39 in order. It is to be noted that FIGS. 40 to 43 are cross-sectional views at a position corresponding to the line A-A' of FIG. 1.

First, the semiconductor layers 106, 107, and 108 are formed in this order on the semiconductor substrate 200 (see FIG. 32). At this occasion, the conductive type of the semiconductor layers 105, 106, and 108 is different from the conductive type of the semiconductor layer 107. Next, the pair of the element isolation films 33 are formed on the semiconductor layers 105 to 108 (see FIG. 33). Then, the insulating layer 102 having a strip-shaped aperture is formed on the top surface of the semiconductor layer 108. The strip-shaped aperture crosses the pair of the element isolation films 33. Thereafter, the semiconductor layers 105 to 108 and the pair of the element isolation films 33 are selectively etched with use of the insulating layer 102 as a mask to form the groove 10A (see FIG. 40). After forming the groove 10A that penetrates through the semiconductor layers 105 to 108 in this way, the insulating film layer 29 and the insulating layer 110 are formed in the groove 10A on the bottom side of the groove 10A. More specifically, the insulating layer 29 is formed in the groove 10A on both side surfaces opposing each other on the bottom side of the groove 10A, and the insulating layer 110 is formed in the groove 10A, and is so formed as to be buried in a part on the bottom surface side of the groove 10A (see FIGS. 41 and 42). The insulating film 29 may be formed on the entire side surfaces of the groove 10A by oxidizing the semiconductor layers 105 to 108 exposed to the side surfaces of the groove 10A, for example. Next, the insulating layer 110 is stacked on an entire surface including the inner surface of the groove 10A, for example. Thereafter, the insulating layer 110 is etched (etched back) together with the insulating layer 29 to form the insulating layer 29 and the insulating layer 110 in the groove 10A only on the bottom surface side of the groove 10A. At this occasion, the insulating layer 29 and the insulating layer 110 are etched (etched back) so that the top surfaces of the insulating layer 29 and the insulating layer 110 are located in the same plane as the boundary surface between the semiconductor layer 106 and the semiconductor layer 107 or at a position higher than the boundary surface (see FIG. 42).

Next, the gate insulating film 28 is formed on the inner surface of the groove 10A. In the groove 10A, the insulating layer 29 and the insulating layer 110 are formed on the bottom surface side. More specifically, the gate insulating film 28 is formed on two side surfaces opposing each other in the inner surface of the groove 10A (see FIG. 43). Then, the gate section 24 is so formed as to be buried in the groove 10A. More specifically, the gate section 24 is formed in the groove 10A at a position opposing the semiconductor layer 107 (see FIG. 43). Thus, the channel section 23 is formed in the semiconductor layer 107. For example, the gate section 24 is stacked on the entire surface including the inner surface of the groove 10A, and then the gate section 24 is etched to cause the gate section 24 to remain only in the groove 10A. At this occasion, the gate section 24 is etched so that the top surface of the gate section 24 is located in the same plane as a boundary surface between the semiconductor layer 107 and the semiconductor layer 108 or at a lower position than the boundary surface, for example. Next, the insulating layer 36 is so formed as to be buried in the groove 10A (see FIG. 43). Thereafter, the conductive layer 34, the stress application film 31, the insulating layer 37, the electrode section 25, the wiring layer 41, the conductive layer 35, the stress application film 32, and the wiring layer 42 are formed as with the foregoing embodiment. Thus, the semiconductor device 1 is manufactured.

The above-described manufacturing method is suitable for the case in which the gate insulating film 28 is made of the silicon oxide. In the following, description is given of a manufacturing method suitable for the case in which the gate insulating film 28 is made of the above-described high-k material. FIGS. 44 and 45 illustrate other examples of the processes of manufacturing the semiconductor device 1 in order. It is to be noted that FIGS. 44 and 45 are cross-sectional views at a position corresponding to the line A-A' of FIG. 1.

First, the insulating film 29 and the insulating layer 110 are formed in the groove 10A on bottom side of the groove 10A by the same processes as the processes illustrated in FIGS. 40 to 42. Next, the gate insulating film 28 made of the above-described high-k material is formed on the entire surface including the inner surface of the groove 10A (see FIG. 44). Then, the gate section 24 made of a metal material is formed in the groove 10A at a position opposing the semiconductor layer 107 by the same process as the process illustrated in FIG. 43 (see FIG. 44). Thus, the channel section 23 is formed in the semiconductor layer 107. Next, the insulating layer 36 is so formed as to be buried in the groove 10A (see FIG. 44). Thereafter, the insulating layer 102 and a part of the gate insulating film 28 are removed (see FIG. 45). The part of the gate insulating film 28 protrudes from the groove 10A. Thereafter, the conductive layer 34, the stress application film 31, the insulating layer 37, the electrode section 25, the wiring layer 41, the conductive layer 41, the conductive layer 35, the stress application film 32, and the wiring layer 42 are formed as with the foregoing embodiment. Thus, the semiconductor device 1 is manufactured.

In this modification example, the transistor 20 is configured of two transistors Tr1 and Tr2 that share one gate section 24. Even in such a case, the semiconductor device 1 according to this modification example may have similar effects to the effects of the semiconductor device 1 according to the foregoing embodiment.

Moreover, in the manufacturing method according to this modification example, the semiconductor layers 105, 106, and 108 corresponding to the source-drain sections 21 and 22 are formed by one-time epitaxial crystal growth. This makes it possible to form the semiconductor layers 105, 106, and 108 extremely easily, as compared with the manufacturing method according to the foregoing embodiment.

Further, in the method of manufacturing the semiconductor device 1 illustrated in FIG. 39, the position of the bottom surface of the gate section 24 is specified by thicknesses of the insulating film 29 and the insulating layer 110. The thicknesses of the insulating film 29 and the insulating layer 110 are specified by adjustment of an amount of etching back. In other words, adjustment of the amounts of etching back of the insulating film 29 and the insulating layer 110 makes it possible to adjust the position where the channel section 23 is to be formed. This makes it possible to adjust a lower end of the gate section 24 to a desired position with respect to a boundary between the channel section 23 and the source-drain section 22. It is therefore possible to adjust the transistor characteristics freely.

Modification Example 5

In the modification example 4, the wiring layers 41 and 42 are shared by the two transistors Tr1 and Tr2. However, for example, one wiring layer 41 and one wiring layer 42 may be provided to each of the two transistors Tr1 and Tr2, as illustrated in FIG. 46. In such a case, the transistor Tr1 and the transistor Tr2 may be driven independently of each other. Moreover, for example, an insulating layer 111 may be provided in the groove 10A, as illustrated in FIG. 47. The insulating layer 111 may divide the gate section 24 into two parts. The transistor Tr2 illustrated in FIG. 47 does not share the gate section 24 with other transistors (e.g., the transistor Tr1), and may include the gate section 24 of its own. For example, after the gate section 24 is formed in the groove 10A, a groove may be provided in the gate section 24 to separate the gate section 24 into two parts, and the insulating layer 111 may be so formed as to be buried in the groove. This makes it possible for each transistor to include its own gate section 24. Even in such a case, it is possible to drive the transistor Tr1 and the transistor Tr2 independently of each other.

Modification Example 6

In the modification examples 4 and 5, the semiconductor layers 106, 107, and 108 may function as stress application sections. In a case in which the semiconductor layers 105, 106, and 108, and the channel section 23 constitute an p-type transistor, and the channel section 23 is formed on the (110) plane and has the channel orientation of <110>, one or both of the semiconductor layer 106 and the semiconductor layer 108 have a larger lattice constant than a lattice constant of the semiconductor layer 107. Moreover, in a case in which the semiconductor layers 105, 106, and 108, and the channel section 23 constitute a p-type transistor, and the channel section 23 is formed on the (110) plane and has the channel orientation of <100>, one or both of the semiconductor layer 106 and the semiconductor layer 108 have a smaller lattice constant than the lattice constant of the semiconductor layer 107. Further, in a case in which the semiconductor layers 105, 106, and 108, and the channel section 23 constitute an n-type transistor, the channel section 23 is formed on the (001) plane and has the channel orientation of <110>, one or both of the semiconductor layer 106 and the semiconductor layer 108 have a smaller lattice constant than the lattice constant of the semiconductor layer 107. In this modification example, the semiconductor layers 106, 107, and 108 may be made of a material having an adjustable lattice constant, and may include SiGe, for example.

In this modification example, the semiconductor layers 106, 107, and 108 may function as the stress application sections. This makes it possible to further improve the transistor characteristics not only by workings of the stress application films 31 and 32 and the element isolation films 33, but also by workings of the semiconductor layers 106, 107, and 108.

It is to be noted that this modification example is applicable to the modification example 2. In other words, in the above description, the semiconductor layers 105 and 106 may be replaced by the source-drain section 22, and the semiconductor layer 108 may be replaced by the source-drain sections 21. Accordingly, even in a case in which this modification example is applied to the modification example 2, it is possible to further improve the transistor characteristics not only by workings of the stress application films 31 and 32 and the element isolation films 33 but also by the workings of the source-drain section 22 and the semiconductor layers 106, 107, and 108.

Modification Example 7

In the foregoing embodiment and the modification examples (the modification examples 1 to 6) of the foregoing embodiment, the insulating layer 36 may have a protrusion 36A in a part opposing the source-drain section 22. For example, the insulating layer 36 may have the protrusion 36A in a part opposing the source-drain section 22, as illustrated in FIG. 48. For example, when the insulating layer 36 is formed in the process in FIG. 16, etching back of a part of the insulating layer 36 other than a part opposing the source-drain section 22 makes it possible to form the protrusion 36A. Thus, the protrusion 36A is provided in the insulating layer 36, and the stress application film 31 is therefore formed on a top surface of the protrusion 36A and surfaces of recessions on both sides of the protrusion 36A. As a result, it is possible to increase stress to be applied from the stress application film 31 to the channel section 23.

Modification Example 8

In the foregoing embodiment and the modification examples (the modification examples 1 to 7) of the foregoing embodiment, a top surface of each of the element isolation films 33 may be formed at a lower position than a top surface of the source-drain section 21. For example, the top surface of the element isolation film 33 may be formed at a lower position than the top surface of the source-drain section 21, as illustrated in FIG. 49. At this occasion, an upper part of the source-drain section 21 (or the conductive layer 34) forms a protrusion 10B with respect to the top surface of the element isolation film 33. For example, when the element isolation film 33 is formed in the process in FIG. 11, the element isolation film 33 may be etched back to allow the top surface of the element isolation film 33 to be disposed at a lower position than the top surface of the source-drain section 21. Thus, the top surface of the element isolation film 33 is disposed at a lower position than the top surface of the source-drain section 21, and the stress application film 31 is therefore formed on the top surface of the source-drain section 21 (or the conductive layer 34) and the top surface of the element isolation film 33. In other words, the stress application film 31 is formed across the protrusion 10B. As a result, it is possible to further increase stress to be applied from the stress application film 31 to the channel section 23.

Modification Example 9

In the foregoing embodiment and the modification examples (the modification examples 1 to 8) of the foregoing embodiment, a rear surface of the element isolation film 33 may be formed at a position recessed from a rear surface of the source-drain section 22. For example, the rear surface of the element isolation film 33 may be formed at a position recessed from the rear surface of the source-drain section 22, as illustrated in FIG. 50. At this occasion, a lower part of the source-drain section 22 (or the conductive layer 35) forms the protrusion 10C with respect to the rear surface of the element isolation film 33. For example, when the element isolation film 33 is etched back after removing the insulating layer 38 in the process in FIG. 22, it is possible to dispose the rear surface of the element isolation film 33 at a position recessed from the rear surface of the source-drain section 22. Thus, the rear surface of the element isolation film 33 is recessed from the rear surface of the source-drain section 22, and the stress application film 32 is therefore formed on the rear surface of the source-drain section 22 (or the conductive layer 35) and the rear surface of the element isolation film 33. In other words, the stress application film 32 is formed across the protrusion 10C. As a result, it is possible to further increase stress to be applied from the stress application film 32 to the channel section 23.

Modification Example 10

In the foregoing embodiment and the modification examples (the modification examples 1 to 9) of the foregoing embodiment, the semiconductor layer 101 may be a Ge substrate or a Ge layer. At this occasion, the semiconductor layers 10, 106, 107, and 108 may be Ge layers, and the channel section 23 may be formed in the Ge layers. In such a case, workings by forming the channel section 23 in the Ge layers make it possible to further improve the transistor characteristics. Moreover, in the foregoing embodiment and the modification examples (the modification examples 1 to 9) of the foregoing embodiment, the semiconductor layer 101 may be a SiGe substrate or a SiGe layer. At this occasion, the semiconductor layers 10, 106, 107, and 108 may be SiGe layers, and the channel section 23 may be formed in the SiGe layers. In such a case, workings by forming the channel section 23 in the SiGe layers make it possible to further improve the transistor characteristics.

In this modification example, the source-drain sections 21 and 22, and the channel section 23 may constitute a p-type transistor, or the semiconductor layers 105, 106, and 108, and the channel section 23 may constitute a p-type transistor. Moreover, the channel section 23 may be formed on the (110) plane, and may have the channel orientation of <110>. At this occasion, the stress application section may be preferably configured to apply compressive stress to the channel section 23. Moreover, in this modification example, the source-drain sections 21 and 22, and the channel section 23 may constitute a p-type transistor, or the semiconductor layers 105, 106, and 108, and the channel section 23 may constitute a p-type transistor. Further, the channel section 23 may be formed on the (110) plane, and may have the channel orientation of <100>. At this occasion, the stress application section may be preferably configured to apply tensile stress to the channel section 23. Furthermore, in this modification example, the source-drain sections 21 and 22, and the channel section 23 may constitute an n-type transistor, or the semiconductor layers 105, 106, and 108, and the channel section 23 may constitute an n-type transistor. Further, the channel section 23 may be formed on the (001) plane, and may have the channel orientation of <110>. At this occasion, the stress application section may be preferably configured to apply tensile stress to the channel section 23. In this modification example, it is possible to maximize mobility by setting the formation plane and the channel orientation of the channel section 23 as described above. Moreover, in this modification example, it is possible to further improve transistor characteristics by configuring the stress application sections as described above, in addition to setting the formation plane and the channel orientation of the channel section 23 as described above.

Modification Example 11

In the foregoing embodiment and the modification examples (the modification examples 1 to 10) of the foregoing embodiment, the stress application section includes the stress application films 31 and 32, and the element isolation film 33. However, in the foregoing embodiment and the modification examples (the modification examples 1 to 10) of the foregoing embodiment, the stress application section may include one or more of the stress application films 31 and 32, and the element isolation film 33.

For example, the stress application film 31 may be omitted, as illustrated in FIGS. 51, 52, 53, and 54. Moreover, for example, the insulating layer 39 that has no or few workings of applying stress to the channel section 23 may be provided in place of the stress application film 32, as illustrated in FIGS. 55, 56, 57, and 58.

Modification Example 12

In the foregoing embodiment and the modification examples (the modification examples 1 to 11) of the foregoing embodiment, the insulating layer 36 may be omitted. For example, the insulating layer 36 may be omitted, and the stress application film 31 may be provided at a position of the insulating layer 36, as illustrated in FIGS. 59, 60, 61, and 62. At this occasion, for example, the stress application film 32 may be further omitted.

Modification Example 13

In the foregoing embodiment and the modification examples (the modification examples 1 to 12) of the foregoing embodiment, the channel section 23 may be formed on two side surfaces that have an equal plane orientation and oppose each other, and other two side surfaces that has an equal plane orientation and oppose each other. For example, the channel section 23 may be formed on two side surfaces (first side surfaces) that oppose each other in the groove 10A and two side surfaces (second side surfaces) that are adjacent to one of the first side surfaces and are orthogonal to the first side surfaces.

The channel section 23 may include, for example, two channel sections 23a, of which one is provided to each of two side surfaces 10D that oppose each other in the inner surface of the groove 10A, as illustrated in FIG. 63. The channel section 23 may further include, for example, two channel sections 23b, of which one is provided to each of two side surfaces 10E adjacent to one of the side surfaces 10D and orthogonal to the side surfaces 10D, as illustrated in FIG. 63.

The gate section 24 may be provided not only in contact with the two channel sections 23a but also in contact with the two channel sections 23b. The gate section 24 may therefore have, for example, a cross shape as viewed in the normal direction to the semiconductor layer 10, as illustrated in FIG. 63.

In this modification example, it is possible to increase the channel width by channel widths of the two channel sections 23b, as compared with the case in which only two channel sections 23a are provided. This makes it possible to further improve the transistor characteristics.

Incidentally, it is assumed that the channel sections 23a are formed on the (110) plane and have the channel orientation of <110>, and the channel sections 23b are formed on the (001) plane and have the channel orientation of <110>. At this occasion, in a case in which the source-drain sections 21 and 22, and the channel section 23 constitute a p-type transistor, or in a case in which the semiconductor layers 105, 106, and 108, and the channel section 23 constitute a p-type transistor, the channel widths of the channel sections 23a may be preferably larger than the channel widths of the channel sections 23b. This is because, in the p-type transistor, mobility is higher in a case with the (110) plane and the orientation of <110> than a case with the (001) plane and the orientation of <110>. Moreover, in a case in which the source-drain sections 21 and 22, and the channel section 23 constitute an n-type transistor, or in a case in which the semiconductor layers 105, 106, and 108, and the channel section 23 constitute an n-type transistor, the channel widths of the channel sections 23b may be preferably larger than the channel widths of the channel sections 23a. This is because, in the n-type transistor, mobility is higher in the case with the (001) plane and the orientation of <110> than in the case with the (110) plane and the orientation of <110>.

Modification Example 14

In the foregoing embodiment and the modification examples (the modification examples 1 to 13) of the foregoing embodiment, an insulating film having a thickness that is thin enough to allow a dipole to be generated and to allow a tunnel current to flow therethrough (more specifically, a thickness of 1 nm or less) may be provided between the electrode section 26 and the conductive layer 35 or between the electrode section 26 and the source-drain section 22. For example, an insulating film 51 may be provided between the electrode section 26 and the conductive layer 35, as illustrated in FIG. 64. The insulating film 51 may have a thickness that is thin enough to allow a dipole to be generated and to allow a tunnel current to flow therethrough (more specifically, a thickness of 1 nm or less). The insulating film 51 may include, for example, $TiO_2$, $Al_2O_3$, $La_2O_3$, an Hf-based material, or a Ta-based material. At this occasion, in a case in which the gate insulating film 28 is made of the above-described high-k material, and the gate section 24 is made of a metal material, the dipole generated at an interface of the gate insulating film 28, makes it possible to decrease a height of a Schottky barrier between the conductive layer 35 and the gate section 24 or between the source-drain section 22 and the gate section 24. As a result, a tunnel current is allowed to flow through the gate insulating film 28.

Modification Example 15

In the foregoing embodiment and the modification examples (the modification examples 1 to 14) of the foregoing embodiment, the element isolation film 33 may not penetrate the semiconductor layer 10 or the semiconductor layers 105 to 108. For example, the element isolation film 33 may not penetrate the semiconductor layer 10, and a part of the semiconductor layer 10 may remain at the bottom of the element isolation film 33, as illustrated in FIG. 65. Even in this case, the semiconductor device 1 according to this modification example has similar effects to the effects of the semiconductor device 1 according to the foregoing embodiment.

3. Second Embodiment

[Configuration]
FIG. 66 illustrates a circuit configuration of a memory circuit 2 according to a second embodiment of the technology. The memory circuit 2 includes a plurality of memory elements 2A that are arranged in a matrix. Each of the memory elements 2A may include a non-volatile element R1 and a switch element Sw. In the memory circuit 2, a plurality of non-volatile elements R1 may be arranged in a matrix, and a plurality of switch elements Sw may be arranged in a matrix, as well. One of the switch elements Sw is provided for each of the non-volatile elements R1. The memory circuit 2 further includes a plurality of word lines WL, a plurality of bit lines BL, and a plurality of data lines DL. The word lines WL extend along a row direction. The bit lines BL and the data lines DL extend along a column direction. One of the word lines WL may be provided for each of rows of the switch elements Sw arranged in a matrix, for example. One of the bit lines BL may be provided for each of columns of the switch elements Sw arranged in a matrix, for example. One of the data lines DL may be provided for each of columns of the non-volatile elements R1 arranged in a matrix, for example.

Non-limiting examples of the non-volatile elements R1 may include an MTJ (Magnetic tunnel junctions) element, a variable resistance film, and a ferroelectric film. The MTJ element may have, for example, a configuration in which an insulating layer is sandwiched between two ferromagnetic layers. One of the ferromagnetic layers has fixed magnetization, and the other ferromagnetic layer has variable magnetization. The MTJ element may be configured to hold information by a difference in resistance value caused by fixing a magnetization direction of one of the ferromagnetic layers and varying a magnetization direction of the other ferromagnetic layer. In the MTJ element, resistance is high when magnetization directions of two magnetic layers are different from each other, and resistance is low when the magnetization directions of the two magnetic layers are the same as each other. The MTJ element reads stored contents (1 or 0) by passing a current to the MTJ element and detecting the current. The variable resistance film may vary resistance by application of a set voltage or a reset voltage, for example. In the variable resistance film, for example, the resistance may be increased upon application of the reset voltage, and the resistance may be decreased upon application of the set voltage. The variable resistance film reads stored contents (1 or 0) by passing a current to the variable resistance film and detecting the current. The ferroelectric film exhibits positive or negative spontaneous polarization with use of ferroelectric hysteresis by application of a voltage to the ferroelectric film. The ferroelectric film reads stored contents (1 or 0) by passing a current to the ferroelectric film and detecting the current.

The switch element Sw may be the semiconductor device 1 according to any of the foregoing embodiment and the modification examples (the modification examples 1 to 15) of the foregoing embodiment. In the switch element Sw, the electrode section 27 is electrically coupled to the word line WL. The electrode section 25 is electrically coupled to the bit line BL. The electrode section 26 is electrically coupled to one end of the non-volatile element R1. The switch element Sw acts as a switch to pass a current to the non-volatile element R1 or not to pass a current to the non-volatile element R1. When the switch element Sw is turned on, the current flows into the non-volatile element R1. When the switch element Sw is turned off, the current flowing into the non-volatile element R1 is stopped.

The word line WL is configured to perform on-off control of the switch element Sw. When a voltage is applied to the word line WL, the electrode section 27 of the switch element Sw corresponding to the word line WL is set to a fixed voltage to turn on the corresponding switch element Sw. The bit line BL is configured to supply the fixed voltage to the electrode section 25 of the switch element Sw. The data line DL is paired with the bit line BL, and is configured to from a current path between the bit line BL and the data line DL. When the switch element Sw is turned on, a current flows through the current path between the bit line BL and the data line DL, and the fixed current flows into the non-volatile element R1. This makes it possible to detect a resistance value of the non-volatile element R1 and read stored contents. Moreover, flowing of a predetermined current makes it possible to write information.

FIG. 67 illustrates an example of a cross-sectional configuration of the memory circuit 2. FIG. 67 illustrates the cross-sectional configuration of the memory circuit 2 including, as the switch element Sw, the semiconductor device 1 illustrated in FIG. 2. In the memory circuit 2, a plurality of semiconductor devices 1 (switch elements Sw) are arranged side by side, and one of the non-volatile elements R1 is disposed on the bottom of each of the semiconductor devices 1 (the switch elements Sw). FIG. 67 illustrates an example of a cross-sectional configuration including two semiconductor devices 1 (switch elements Sw) and two non-volatile elements R1. The two semiconductor devices (switch elements Sw) are disposed side by side along the column direction. One of the two non-volatile elements R1 is disposed at the bottom of each of the two semiconductor devices 1 (switch elements Sw).

In each of the memory elements 2A, the wiring layer 41 (the bit line BL) coupled to two electrode sections 25 is provided directly above the two electrode sections 25, and the non-volatile element R1 coupled to the electrode section 26 is provided directly below the electrode section 26. In each of the memory elements 2A, one end of the non-volatile element R1 is coupled to the electrode section 26, and the other end of the non-volatile element R1 is coupled to the data line DL through a conductive coupling section 44. The non-volatile element R1 and the coupling section 44 are buried in an insulating layer 45, and the data line DL is formed on a rear surface of the insulating layer 45.

In this embodiment, the semiconductor device 1 according to any of the foregoing embodiment and the modification examples (the modification examples 1 to 15) of the foregoing embodiment is used as the switch element Sw that controls a current flowing into the non-volatile element R1. The semiconductor device 1 has superior transistor characteristics, as compared with the transistor in which all electrodes are provided on the top surface side of the semiconductor layer. It is therefore possible to select a material having high retention characteristics as a material of the non-volatile element R1. As a result, it is possible to secure performance stability as a memory.

4. Modification Example of Second Embodiment

The second embodiment exemplifies that the semiconductor device 1 illustrated in FIG. 1 is provided as the switch element Sw; however, for example, the semiconductor device 1 illustrated in FIG. 46 may be provided, as illustrated in FIG. 68. At this occasion, one transistor Tr1 and one transistor Tr2 may be provided for each of the memory devices 2A. The two transistors Tr1 and Tr2 may share one gate section 23. Moreover, in the second embodiment, the semiconductor device 1 illustrated in FIG. 47 may be provided as the switch element Sw, for example.

Further, in the second embodiment, a volatile element R2 may be used in place of the non-volatile element R1. At this occasion, for example, a common potential line (e.g., a ground line) shared by the memory elements 2A may be provided in place of the bit line BL, as illustrated in FIG. 69. Non-limiting examples of the volatile element R2 may include a capacitor element.

Furthermore, in the second embodiment, the plurality of memory elements 2A are arranged in a matrix. However, the memory elements 2A may be arranged in one line. Moreover, for example, the memory circuit 2 may be configured of one memory element 2A, as illustrated in FIGS. 70 and 71.

Moreover, in the second embodiment and the modification examples of the second embodiment, a volatile element such as a capacitor may be provided in place of the non-volatile element R1.

Although the technology has been described above with reference to the example embodiments and the modification examples, the technology is not limited thereto, and may be modified in a variety of ways. Note that the effects described in the present specification are illustrative and non-limiting. The technology may have effects other than those described in the present specification.

In the foregoing embodiments and the modification examples of the foregoing embodiments, for example, the (110) plane may be an example of a {110} plane, and the (001) plane may be an example of a {100} plane.

Moreover, the technology may include the following configurations, for example.

(1) A semiconductor device including:

a first diffusion section in a semiconductor layer having a groove, the first diffusion section formed at or in the vicinity of a bottom of the groove;

a second diffusion section formed at an upper end of the groove in the semiconductor layer;

a channel section formed between the first diffusion section and the second diffusion section in the semiconductor layer;

a gate section buried in the groove at a position opposing the channel section;

a first electrode section electrically coupled to the first diffusion section, and provided on rear surface side of the semiconductor layer;

a second electrode section electrically coupled to the second diffusion section, and provided on top surface side of the semiconductor layer;

a third electrode section electrically coupled to the gate section, and provided on the top surface side of the semiconductor layer; and a stress application section configured to apply one of compressive stress and tensile stress to the channel section in a normal direction to the semiconductor layer.

(2) The semiconductor device according to (1), wherein the stress application section includes one or more of the following (a) to (d):

(a) a first stress application film provided on the top surface side of the semiconductor layer;

(b) a second stress application film provided on the rear surface side of the semiconductor layer;

(c) a third stress application film provided on both sides of the channel section; and (d) one or both of the first diffusion section and the second diffusion section each having a different lattice constant from a lattice constant of the channel section.

(3) The semiconductor device according to (1) or (2), wherein the stress application section is configured to apply the compressive stress to the channel section, the first diffusion section, the second diffusion section, and the channel section constitute a p-type transistor, and the channel section is formed on a {110} plane, and has a channel orientation of <110>.

(4) The semiconductor device according to (1) or (2), wherein the stress application section is configured to apply the tensile stress to the channel section, the first diffusion section, the second diffusion section, and the channel section constitute a p-type transistor, and the channel section is formed on a {110} plane, and has a channel orientation of <100>.

(5) The semiconductor device according to (1) or (2), wherein the stress application section is configured to apply the tensile stress to the channel section, the first diffusion section, the second diffusion section, and the channel section constitute an n-type transistor, and the channel section is formed on a {100} plane, and has a channel orientation of <110>.

(6) The semiconductor device according to any one of (1) to (5), wherein the channel section includes one of Ge and SiGe.

(7) The semiconductor device according to (2), wherein one or both of the first diffusion section and the second diffusion section have the lattice constant that is larger than the lattice constant of the channel section, the first diffusion section, the second diffusion section, and the channel section constitute a p-type transistor, and the channel section is formed on a {110} plane, and has a channel orientation of <110>.

(8) The semiconductor device according to (2), wherein one or both of the first diffusion section and the second diffusion section have the lattice constant that is smaller than the lattice constant of the channel section, the first diffusion section, the second diffusion section, and the channel section constitute a p-type transistor, and the channel section is formed on a {110} plane, and has a channel orientation of <100>.

(9) The semiconductor device according to (2), wherein one or both of the first diffusion section and the second diffusion section have the lattice constant that is smaller than the lattice constant of the channel section, the first diffusion section, the second diffusion section, and the channel section constitute an n-type transistor, and the channel section is formed on a {100} plane, and has a channel orientation of <110>.

(10) The semiconductor device according to (2), wherein a top surface of the third stress application film is formed at a lower position than a top surface of the second diffusion section, and the first stress application film is formed on the top surface of the second diffusion section and the top surface of the third stress application film.

(11) The semiconductor device according to (2), wherein a rear surface of the third stress application film is formed at a position recessed from a rear surface of the first diffusion section, and the second stress application film is formed on a top surface of the first diffusion section and the rear surface of the third stress application film.

(12) The semiconductor device according to any one of (1) to (11), wherein the channel section is formed on each of two side surfaces that oppose each other in the groove.

(13) The semiconductor device according to any one of (1) to (11), wherein the channel section includes a first channel section and a second channel section, the first channel section being formed on two first side surfaces that oppose each other in the groove, and the second channel section being formed on two second side surfaces that are adjacent to the first side surfaces and are orthogonal to the first side surfaces.

(14) The semiconductor device according to (13), wherein the channel section includes a first channel section and a second channel section, the first channel section being formed on two first side surfaces that oppose each other in the groove, and the second channel section being formed on two second side surfaces that are adjacent to the first side surfaces and are orthogonal to the first side surfaces, the first diffusion section, the second diffusion section, and the channel section constitute a p-type transistor, the first channel section is formed on a {110} plane, and has a channel orientation of <110>, the second channel section is formed on a {100} plane, and has a channel orientation of <110>, and a channel width of the first channel section is larger than a channel width of the second channel section.

(15) The semiconductor device according to (13), wherein the channel section includes a first channel section and a second channel section, the first channel section being formed on two first side surfaces that oppose each other in the groove, and the second channel section being formed on two second side surfaces that are adjacent to the first side surfaces and are orthogonal to the first side surfaces, the first diffusion section, the second diffusion section, and the channel section constitute an n-type transistor, the first channel section is formed on a {110} plane, and has a channel orientation of <110>, the second channel section is formed on a {100} plane, and has a channel orientation of <110>, and a channel width of the second channel section is larger than a channel width of the first channel section.

(16) The semiconductor device according to any one of (1) to (15), further including an insulating film provided between the first electrode section and first diffusion section and having a thickness that is thin enough to allow a dipole to be generated and to allow a tunnel current to flow therethrough.

(17) The semiconductor device according to any one of (1) to (16), further an insulating layer buried in the groove on bottom side of the groove, wherein the gate section is formed on the insulating layer.

(18) A memory circuit provided with a switch element and one of a non-volatile element and a volatile element, the switch element being configured to control a current flowing through one of the non-volatile element and the volatile element, the switch element including:
a first diffusion section in a semiconductor layer having a groove, the first diffusion section formed at or in the vicinity of a bottom of the groove;
a second diffusion section formed at an upper end of the groove in the semiconductor layer;
a channel section formed between the first diffusion section and the second diffusion section in the semiconductor layer;
a gate section buried in the groove at a position opposing the channel section;
a first electrode section electrically coupled to the first diffusion section, and provided on rear surface side of the semiconductor layer;
a second electrode section electrically coupled to the second diffusion section, and provided on top surface side of the semiconductor layer;
a third electrode section electrically coupled to the gate section, and provided on the top surface side of the semiconductor layer; and
a stress application section configured to apply one of compressive stress and tensile stress to the channel section in a normal direction to the semiconductor layer.
(19) The memory circuit according to (18), wherein the non-volatile element is an MTJ (Magnetic tunnel junctions) element.
(20) A method of manufacturing a semiconductor device, the method including:
forming, in a semiconductor layer having a groove, a first diffusion section through the groove and forming a second diffusion section, thereby forming a channel section between the first diffusion section and second diffusion section, the first diffusion section being formed at a bottom of the groove, and the second diffusion section being formed at an upper end of the groove;
forming a gate insulating film on an entire surface including an inner surface of the groove, followed by forming a gate section and removing a part protruding from the groove of the gate insulating film, the gate insulating film being made of a high-k material having a higher relative dielectric constant than a relative dielectric constant of a silicon oxide, and the gate section being made of a metal material and formed at a position opposing the channel section in the groove; and
forming a stress application section, the stress application section being configured to apply one of compressive stress and tensile stress to the channel section in a normal direction to the semiconductor layer.
(21) A method of manufacturing a semiconductor device, the method further including:
forming a groove, followed by forming an insulating layer, the groove penetrating a semiconductor layer that includes a first semiconductor layer of a first conductive type, a second semiconductor layer of a second conductive type, and a third semiconductor layer of the first conductive type, the first semiconductor layer, the second semiconductor layer, and the third semiconductor layer being formed in this order, and the insulating layer being formed on bottom surface side of the groove in the groove;
forming a gate insulating film on an entire surface including an inner surface of the groove in which the insulating layer is formed, followed by forming a gate section, thereby forming a channel section in the second semiconductor layer, and removing a part protruding from the groove of the gate insulating film the gate insulating film being made of a high-k material having a higher relative dielectric constant than a relative dielectric constant of a silicon oxide, and the gate section being made of a metal material and formed at a position opposing the channel section inside the groove; and
forming a stress application section, the stress application section being configured to apply one of compressive stress and tensile stress to the channel section in a normal direction to the semiconductor layer.
(22) The method of manufacturing the semiconductor device according to (20) or (21), the method further including
forming a first electrode section, a second electrode section, and a third electrode section, the first electrode section being provided on rear surface side of the semiconductor layer and being electrically coupled to the first diffusion section, the second electrode section being provided on top surface side of the semiconductor layer and being electrically coupled to the second diffusion section, and the third electrode section being provided on the top surface side of the semiconductor layer and being electrically coupled to the gate section.

This application claims the benefit of Japanese Priority Patent Application JP 2014-1806 filed with the Japan patent office Jan. 8, 2014, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:
1. A semiconductor device, comprising:
a semiconductor layer comprising a groove;
a first diffusion section in the semiconductor layer, wherein the first diffusion section is at or in a vicinity of a bottom of the groove;
a second diffusion section at an upper end of the groove in the semiconductor layer;
a channel section between the first diffusion section and the second diffusion section in the semiconductor layer;
a gate section in the groove at a position opposite to the channel section, wherein the position of the gate section is at a lower end of the groove than the upper end of the groove;
a first electrode section on a rear surface side of the semiconductor layer, wherein the first electrode section is electrically coupled to the first diffusion section;
a second electrode section on a top surface side of the semiconductor layer, wherein the second electrode section is electrically coupled to the second diffusion section;
a third electrode section on the top surface side of the semiconductor layer, wherein the third electrode section is electrically coupled to the gate section; and
a stress application section configured to apply one of compressive stress or tensile stress to the channel section in a normal direction to the semiconductor layer,
wherein the first diffusion section, the second diffusion section, and the channel section constitute a p-type transistor, and
wherein the channel section is on a {110} plane, and includes a channel orientation of <110>.

2. The semiconductor device according to claim 1, wherein the stress application section includes at least one of
a first stress application film on the top surface side of the semiconductor layer,
a second stress application film on the rear surface side of the semiconductor layer,
a third stress application film on both sides of the channel section, or
at least one of the first diffusion section or the second diffusion section, wherein a first lattice constant of each of the at least one of the first diffusion section or the second diffusion section is different from a second lattice constant of the channel section.

3. The semiconductor device according to claim 2, wherein
the stress application section is configured to apply the compressive stress to the channel section.

4. The semiconductor device according to claim 2, wherein
the stress application section is configured to apply the tensile stress to the channel section.

5. The semiconductor device according to claim 2, wherein the channel section includes one of Ge or SiGe.

6. The semiconductor device according to claim 2, wherein
the first lattice constant is larger than the second lattice constant.

7. The semiconductor device according to claim 2, wherein
the first lattice constant is smaller than the second lattice constant.

8. The semiconductor device according to claim 2, wherein
a top surface of the third stress application film is formed at a lower position than a top surface of the second diffusion section, and
the first stress application film is formed on the top surface of the second diffusion section and the top surface of the third stress application film.

9. The semiconductor device according to claim 2, wherein
a rear surface of the third stress application film is formed at a position recessed from a rear surface of the first diffusion section, and
the second stress application film is formed on a top surface of the first diffusion section and the rear surface of the third stress application film.

10. The semiconductor device according to claim 1, wherein the channel section is on each of two side surfaces, and wherein a first side surface of the two side surfaces is opposite to a second side surface of the two side surfaces in the groove.

11. The semiconductor device according to claim 1, wherein the channel section includes a first channel section and a second channel section, the first channel section being formed on two first side surfaces that oppose each other in the groove, and the second channel section being formed on two second side surfaces that are adjacent to the first side surfaces and are orthogonal to the first side surfaces.

12. The semiconductor device according to claim 11, wherein
the first diffusion section, the second diffusion section, and the channel section constitute a p-type transistor,
the first channel section is formed on a {110} plane, and has a channel orientation of <110>,
the second channel section is formed on a {100} plane, and has a channel orientation of <110>, and
a channel width of the first channel section is larger than a channel width of the second channel section.

13. The semiconductor device according to claim 11, wherein
the first diffusion section, the second diffusion section, and the channel section constitute an n-type transistor,
the first channel section is formed on a {110} plane, and has a channel orientation of <110>,
the second channel section is formed on a {100} plane, and has a channel orientation of <110>, and
a channel width of the second channel section is larger than a channel width of the first channel section.

14. The semiconductor device according to claim 1, further comprising an insulating film between the first electrode section and first diffusion section, wherein generation of a dipole and flow of a tunnel current are based on a thickness of the insulating film.

15. The semiconductor device according to claim 1, further comprising an insulating layer in the groove on bottom side of the groove, wherein the gate section is on the insulating layer.

16. A memory circuit, comprising:
one of a non-volatile element or a volatile element,
a switch element configured to control a flow of current via one of the non volatile element or the volatile element,
wherein the switch element comprises:
a first diffusion section in a semiconductor layer that includes a groove, the first diffusion section is at or in a vicinity of a bottom of the groove;
a second diffusion section at an upper end of the groove in the semiconductor layer;
a channel section between the first diffusion section and the second diffusion section in the semiconductor layer;
a gate section in the groove at a position opposite to the channel section, wherein the position of the gate section is at a lower end of the groove than the upper end of the groove;
a first electrode section on a rear surface side of the semiconductor layer, wherein the first electrode section is electrically coupled to the first diffusion section;
a second electrode section on a top surface side of the semiconductor layer, wherein the second electrode section is electrically coupled to the second diffusion section;
a third electrode section on the top surface side of the semiconductor layer, wherein the third electrode section is electrically coupled to the gate section; and
a stress application section configured to apply one of compressive stress or tensile stress to the channel section in a normal direction to the semiconductor layer,
wherein the first diffusion section, the second diffusion section, and the channel section constitute a p-type transistor, and
wherein the channel section is on a {110} plane, and includes a channel orientation of <110>.

17. The memory circuit according to claim 16, wherein the non-volatile element is a Magnetic tunnel junction (MTJ) element.

18. A method of manufacturing a semiconductor device, the method comprising:
forming, in a semiconductor layer having a groove, a first diffusion section through the groove and forming a second diffusion section, thereby forming a channel section between the first diffusion section and second diffusion section, the first diffusion section being formed at a bottom of the groove, and the second diffusion section being formed at an upper end of the groove;

forming a gate insulating film on an entire surface including an inner surface of the groove, followed by forming a gate section and removing a part protruding from the groove of the gate insulating film, the gate insulating film being made of a high-k material having a higher relative dielectric constant than a relative dielectric constant of a silicon oxide, and the gate section being made of a metal material and formed at a position opposing the channel section in the groove;

forming a stress application section, the stress application section being configured to apply one of compressive stress and tensile stress to the channel section in a normal direction to the semiconductor layer; and forming a first electrode section, a second electrode section, and a third electrode section, the first electrode section being provided on rear surface side of the semiconductor layer and being electrically coupled to the first diffusion section, the second electrode section being provided on top surface side of the semiconductor layer and being electrically coupled to the second diffusion section, and the third electrode section being provided on the top surface side of the semiconductor layer and being electrically coupled to the gate section.

19. A semiconductor device, comprising:
a semiconductor layer comprising a groove;
a first diffusion section in the semiconductor layer, wherein the first diffusion section is at or in a vicinity of a bottom of the groove;
a second diffusion section at an upper end of the groove in the semiconductor layer;
a channel section between the first diffusion section and the second diffusion section in the semiconductor layer;
a gate section in the groove at a position opposite to the channel section, wherein the position of the gate section is at a lower end of the groove than the upper end of the groove;
a first electrode section on rear surface side of the semiconductor layer, wherein the first electrode section is electrically coupled to the first diffusion section;
a second electrode section on a top surface side of the semiconductor layer, wherein the second electrode section is electrically coupled to the second diffusion section;
a third electrode section on the top surface side of the semiconductor layer, wherein the third electrode section is electrically coupled to the gate section;
a stress application section configured to apply one of compressive stress or tensile stress to the channel section in a normal direction to the semiconductor layer; and
an insulating film between the first electrode section and first diffusion section, wherein generation of a dipole and flow of a tunnel current, are based on a thickness of the insulating film.

20. A semiconductor device, comprising:
a semiconductor layer comprising a groove;
a first diffusion section in the semiconductor layer, wherein the first diffusion section is at or in a vicinity of a bottom of the groove;
a second diffusion section at an upper end of the groove in the semiconductor layer;
a channel section between the first diffusion section and the second diffusion section in the semiconductor layer;
a gate section in the groove at a position opposite to the channel section, wherein the position of the gate section is at a lower end of the groove than the upper end of the groove;
a first electrode section on a rear surface side of the semiconductor layer, wherein the first electrode section is electrically coupled to the first diffusion section;
a second electrode section on a top surface side of the semiconductor layer, wherein the second electrode section is electrically coupled to the second diffusion section;
a third electrode section on the top surface side of the semiconductor layer, wherein the third electrode section is electrically coupled to the gate section; and
a stress application section configured to apply one of compressive stress or tensile stress to the channel section in a normal direction to the semiconductor layer,
wherein the first diffusion section, the second diffusion section, and the channel section constitute a p-type transistor, and
wherein the channel section is on a {110} plane, and includes a channel orientation of <100>.

21. A semiconductor device, comprising:
a semiconductor layer comprising a groove;
a first diffusion section in the semiconductor layer, wherein the first diffusion section is at or in a vicinity of a bottom of the groove;
a second diffusion section at an upper end of the groove in the semiconductor layer;
a channel section between the first diffusion section and the second diffusion section in the semiconductor layer;
a gate section in the groove at a position opposite to the channel section, wherein the position of the gate section is at a lower end of the groove than the upper end of the groove;
a first electrode section on a rear surface side of the semiconductor layer, wherein the first electrode section is electrically coupled to the first diffusion section;
a second electrode section on a top surface side of the semiconductor layer, wherein the second electrode section is electrically coupled to the second diffusion section;
a third electrode section on the top surface side of the semiconductor layer, wherein the third electrode section is electrically coupled to the gate section; and
a stress application section configured to apply one of compressive stress or tensile stress to the channel section in a normal direction to the semiconductor layer,
wherein the first diffusion section, the second diffusion section, and the channel section constitute a n-type transistor, and
wherein the channel section is on a {100} plane, and includes a channel orientation of <110>.

* * * * *